United States Patent [19]
Yamaguchi et al.

[11] Patent Number: 5,557,231
[45] Date of Patent: Sep. 17, 1996

[54] SEMICONDUCTOR DEVICE WITH IMPROVED SUBSTRATE BIAS VOLTAGE GENERATING CIRCUIT

[75] Inventors: Yasuo Yamaguchi; Tadashi Nishimura, both of Hyogo-ken, Japan

[73] Assignee: Mitsubishi Denki Kabushiki Kaisha, Tokyo, Japan

[21] Appl. No.: 291,057

[22] Filed: Aug. 15, 1994

Related U.S. Application Data

[63] Continuation of Ser. No. 38,987, Mar. 29, 1993, abandoned.

[30] Foreign Application Priority Data

Mar. 30, 1992 [JP] Japan .................................. 4-074184

[51] Int. Cl.$^6$ ............................................. H01L 27/04
[52] U.S. Cl. .......................... 327/534; 327/536; 327/537
[58] Field of Search .............................. 307/296.1, 296.2, 307/296.4, 296.7; 257/66, 67; 327/534, 535, 537, 536, 547

[56] References Cited

U.S. PATENT DOCUMENTS

| | | | |
|---|---|---|---|
| 4,096,584 | 6/1978 | Owen, III. et al. | 307/264 |
| 4,233,672 | 11/1980 | Suzuki et al. | 307/296.2 |
| 4,378,506 | 3/1983 | Taira | 307/296.2 |
| 4,409,496 | 10/1983 | Baba | 307/296.2 |
| 4,455,628 | 6/1984 | Ozaki et al. | 307/296.2 |
| 4,460,835 | 7/1984 | Masuoka | 307/296.2 |
| 4,631,421 | 12/1986 | Inoue et al. | 307/296.2 |
| 4,883,976 | 11/1989 | Deane | 307/296.2 |
| 4,946,799 | 8/1990 | Blake et al. | 437/41 |
| 4,961,007 | 10/1990 | Kumanoya et al. | 307/296.2 |
| 5,022,005 | 6/1991 | Tohnishi | 307/296.2 |
| 5,034,625 | 7/1991 | Min et al. | 307/296.2 |
| 5,034,789 | 7/1991 | Black | 257/23.7 |
| 5,043,597 | 8/1991 | Furuyama et al. | 307/296.2 |
| 5,124,574 | 6/1992 | Ibaraki | 307/296.2 |
| 5,146,110 | 9/1992 | Kim et al. | 307/296.2 |
| 5,162,666 | 11/1992 | Tran | 307/243 |
| 5,191,397 | 3/1993 | Yoshida | 257/347 |
| 5,202,588 | 4/1993 | Matsuo et al. | 307/296.2 |
| 5,208,557 | 5/1993 | Kersh, III | 307/296.2 |
| 5,233,207 | 8/1993 | Anzai | 357/66 |
| 5,264,721 | 11/1993 | Gotou | 257/349 |
| 5,360,752 | 11/1994 | Brady et al. | 437/62 |
| 5,461,338 | 10/1995 | Hirayama et al. | 327/534 |

FOREIGN PATENT DOCUMENTS

| | | |
|---|---|---|
| 0039946A3 | 11/1981 | European Pat. Off. . |
| 3-29183 | 2/1991 | Japan . |
| WO89/05545 | 6/1989 | WIPO . |

OTHER PUBLICATIONS

Solid States Electronic Device By Ben G. Streetman 1980.
Field Effect of Transistor Device By Robert F. Pierret vol. IV, 1990.
Electronic Circuit, by Donald L. Schilling, 1989.
"Calculated Threshold–Voltage Characteristics Of An XMOS Transistor Having An Additional Bottom Gate", Solid State Electronics, vol. 27, Nos. 8/9 (1984), pp. 827–828.

*Primary Examiner*—Timothy P. Callahan
*Assistant Examiner*—T. Lam
*Attorney, Agent, or Firm*—Lowe, Price, LeBlanc & Becker

[57] ABSTRACT

A semiconductor device including an NMOS transistor includes a first bias generating circuit 30 for generating a substrate bias VBB1 for making smaller the amount of leak current in an inactive state, a second bias generating circuit 31 for generating a substrate bias VBB2 for increasing drivability of supplying current in the active state of the NMOS transistor, and a bias selecting circuit 32 responsive to a control signal CNT for supplying the substrate bias VBB2 instead of the substrate bias VBB1 to the silicon substrate 1. By changing the potential of the substrate bias in the standby state and the active state, power consumption in the standby state can be reduced and the speed of operation in the active state can be improved.

12 Claims, 20 Drawing Sheets

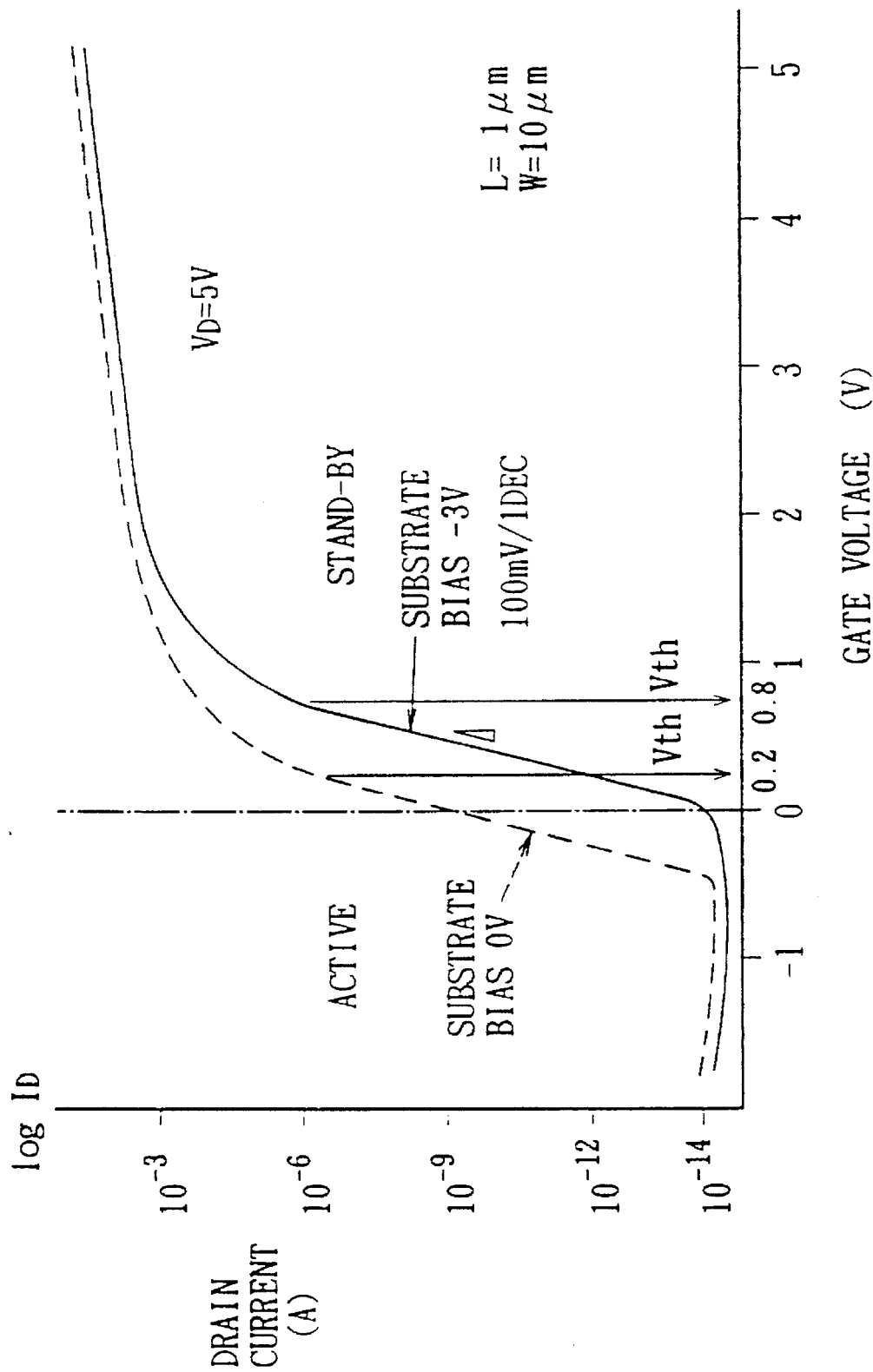

F I G. 2 4   PRIOR ART
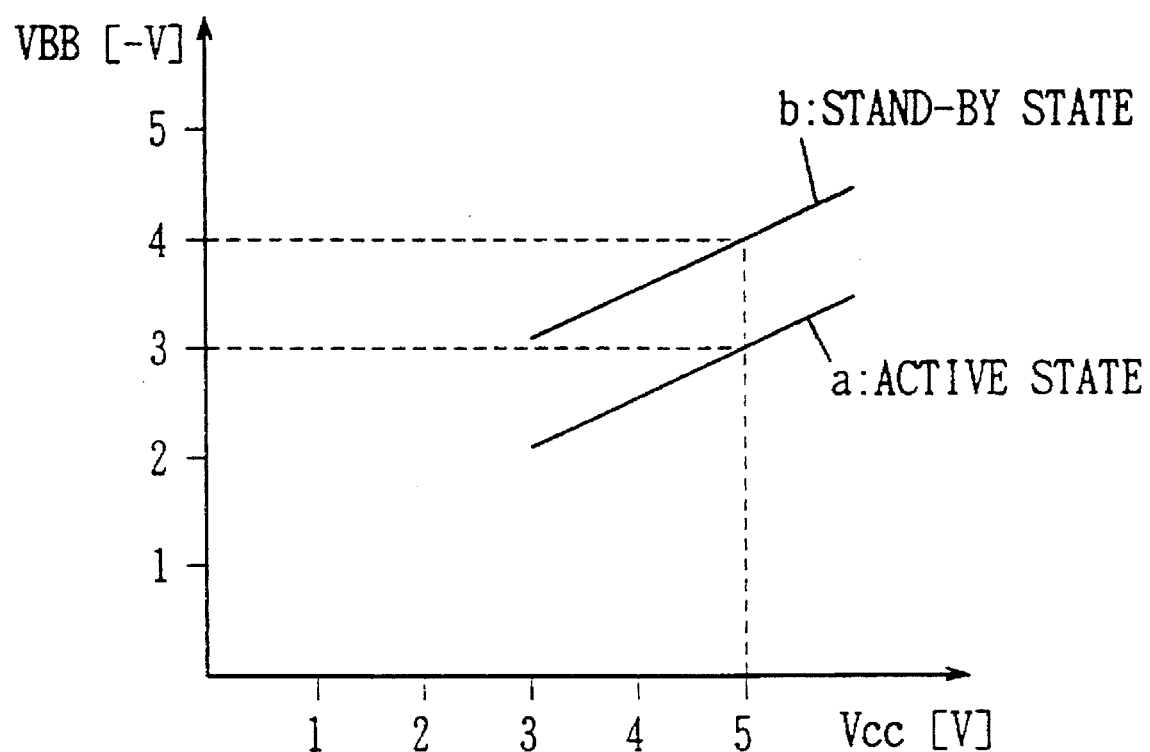

SEMICONDUCTOR DEVICE WITH IMPROVED SUBSTRATE BIAS VOLTAGE GENERATING CIRCUIT

This application Ser. No. 08/038,987 filed Mar.29,1993 has been abandoned.

BACKGROUND OF THE INVENTION

1. Field of the Invention

The present invention relates to a semiconductor device including a MOS (Metal Oxide Semiconductor) field effect transistor (hereinafter referred to as "MOSFET") formed on a semiconductor substrate and, more particularly, to an improvement in supplying a substrate bias voltage.

2. Description of the Background Art

Generally, a semiconductor device such as a dynamic random access memory or a static random access memory is constituted by a number of MOS transistors formed on one semiconductor substrate. Normally, the potential of the semiconductor substrate is constantly maintained in a predetermined range in such a semiconductor device.

FIG. 20 is a schematic block diagram of such a semiconductor device. Referring to FIG. 20, the semiconductor device 100 includes functional circuit (or internal circuit) 110 and a substrate bias generating circuit 120 formed on a single semiconductor substrate. The functional circuit 110 is constituted by a number of MOS transistors for implementing functions necessary for the semiconductor device 100. The substrate bias generating circuit 120 is also constituted by MOS transistors and it generates a substrate bias voltage $V_{BB}$ for maintaining the semiconductor substrate 1 at a predetermined negative potential.

FIG. 21 is a cross sectional view showing a portion of a cross sectional structure of a general integrated circuit device. The functional circuit 110 shown in FIG. 20 includes the sectional structure shown in FIG. 21. FIG. 21 shows, as an example, an NMOS transistor and interconnections provided in the periphery thereof. Referring to FIG. 21, the NMOS transistor includes N type impurity regions 2 and 3 serving as source and drain formed near the main surface of the semiconductor substrate 1 and a gate electrode 5. A gate dielectric thin film 4 is formed between the gate electrode 5 and the substrate 1. P type impurities of low concentration (for example $10^{16}$ to $10^{17}/cm^3$) are introduced to the silicon substrate 1 below the gate electrode 5. N type impurities of high concentration (for example, $10^{19}$ to $10^{21}/cm^3$) are introduced to the source region 2 and the drain region 3. Interconnection layers 22 and 23 having low resistance are connected through contact holes formed in an interlayer insulating film 24 to the gate electrode 5, the source region 2 and to the drain region 3.

In the MOS transistor formed as described above, when a positive voltage is applied to the gate electrode 5, N type carriers (electrons) are induced at an upper layer portion of the silicon substrate 1 of $P^{31}$ region. More specifically, the surface of the silicon substrate 1 is inverted to N type, so that the surface of the silicon substrate 1 has the same type of conductivity as that of the source region 2 and the drain region 3. Thus it becomes possible for a current to flow between the drain region and source region. The concentration of the N type carriers induced on the surface of the silicon substrate 1 changes dependent on the voltage applied to the gate electrode 5, and therefore the amount of current flowing between the source region 2 and the drain region 3 can be controlled by the gate voltage.

In operation, when the NMOS transistor is rendered conductive, hot electrons and holes which constitute pairs are generated near the drain region 3. Most of the generated hot electrons flow to the drain region 3. Meanwhile, most of the generated holes flow to the silicon substrate 1. Thus the potential of the silicon substrate 1 rises. The rise of the potential of the silicon substrate 1 causes the following problem.

Since PN junctions are formed between the P type silicon substrate 1 and the source region 2 and between the substrate 1 and the drain region 3, the PN junctions are brought to the forward bias state. Accordingly, leak current flows between the silicon substrate 1 and the source region 2 and the drain region 3. Consequently, there is a possibility that the channel is not formed between the source region 2 and the drain region 3, or that the signal to be transmitted is delayed.

In order to prevent the above problem, the substrate bias generating circuit 120 for keeping the potential $V_{BB}$ of the substrate 1 at about $-1$ V, for example, is provided.

The conventional operation for supplying substrate bias will be described with reference to FIG. 22. FIG. 22 shows the threshold voltages and the drivability of supplying current when the substrate bias potential is set at $-1$ V. Referring to FIG. 22, the solid lines represent the threshold voltage and the drivability of supplying current when the substrate bias potential is at $-1$ V. In the figure, (a) represents the substrate bias potential, (b) represents the threshold voltages of the NMOS transistor and (c) represents the drivability of supplying current of the NMOS transistor.

A constant substrate bias is applied (in FIG. 22, $-1$ V) to the silicon substrate 1 no matter whether it is in an active state or in a standby state. The threshold voltage changes in the negative direction when the substrate bias changes in the positive direction. By the change of the threshold voltage, the drivability of supplying current also changes. In the NMOS transistor, when the threshold voltage changes in the negative direction, the drivability of supplying current increases, while in a PMOS transistor, when the threshold voltage changes in the positive direction, the drivability of supplying current increases. However, in the conventional method of supplying the substrate bias, a constant substrate bias is applied, and therefore the threshold voltage and the current supplying drivability do not change as shown in FIG. 22.

Since the conventional semiconductor device is structured as described above, when the threshold voltage is set to minimize the leak current in the standby state, the drivability of supplying current at the active state becomes small, which prevents high speed operation.

Conversely, if the drivability of supplying current is increased and the threshold value is lowered in order to operate the NMOS transistor at high speed, the leak current in the standby state increases.

Now, Japanese Patent Laying-Open No. 3-29183 discloses a semiconductor memory device in which substrate potential is switched between an active state and a standby state and in which a deeper substrate bias voltage is applied at the standby state than at the active state.

FIG. 23 is a block diagram showing the device for switching the substrate bias disclosed in the aforementioned published Japanese Patent Application. Referring to FIG. 23, this device includes an identifying circuit 101 for identifying the active mode and the standby mode; a substrate potential generating circuit 103 having large current drivability for generating a second substrate potential at the active state; a substrate potential generating circuit 102 having smaller current drivability for generating a first substrate potential causing deeper reverse bias than the second substrate potential at the standby state; a comparing circuit 105 for comparing the substrate potential and a reference potential corresponding to the second substrate potential; a comparing circuit 104 for comparing the substrate potential with a reference potential corresponding to the first substrate potential; and a control portion 106 for selecting one of the substrate potential generating circuits 102 and 103 in response to an output signal from the identifying circuit 101 and maintaining constant the substrate potential generated by the selected substrate potential generating circuit in response to output signals from the comparing circuits 104 and 105.

The current drivability of the substrate potential generating circuit 102 is smaller than that of the circuit 103, since, at the standby state, the first substrate potential is generated only to prevent dissipation of the data stored in the memory cell. However, since the current drivability is small, there is a possibility that the PN junction is set to the forward biased state by the external noise. In order to prevent the forward biased state, the first substrate potential is set to a potential providing deep reverse bias.

In this prior art, the second substrate potential is made to provide shallower bias than the first substrate potential, since at the active state, there is an internal signal (for example, word lines of the memory) which is raised to be higher than the supply voltage and when the same reverse bias as the first substrate potential is applied, there is a possibility that the breakdown voltage of the PN junction is exceeded.

In operation, when a signal designating the active mode is input externally, identifying circuit 101 recognizes that it is the active mode, and allows control portion 106 control in a manner corresponding to the active mode. Control portion 106 to controls the substrate potential generating circuit 103 in response to the output from comparing circuit 105 and maintains the voltage of the substrate at the second substrate potential.

Meanwhile, when a signal designating the standby mode is input externally, identifying circuit 101 recognizes that it is the standby mode, and let the control portion 106 control in the manner corresponding to the standby mode. Control portion 106 controls substrate potential generating circuit 102 in response to the output from comparing circuit 104 and maintains the substrate potential at the first substrate potential. By doing so, the reverse bias at the standby state can be made deeper than the reverse bias at the active state, and therefore dissipation of data stored in the memory cell in the standby state can be prevented.

FIG. 24 is a graph showing an example of the relation between the supply voltage Vcc and the first and second substrate potentials b and a generated by the device shown in FIG. 23. As is apparent from FIG. 24, when the supply voltage Vcc is at 5 V, the first substrate potential b is −4 V and the second substrate potential a is −3 V. The voltage (−3 V) of the second substrate potential is similar to the substrate potential of the conventional general semiconductor device, and it is determined based on the relation with respect to the impurity concentration doped in the substrate.

Therefore, the speed of operation of the semiconductor device is approximately the same as that in the conventional general semiconductor device, and therefore, the speed of operation of the transistor can not be expected to be faster in the active state.

In order to increase the speed of operation of the semiconductor memory device, it is necessary to determine the voltage of the substrate potential taking into consideration the current drivability and the threshold voltage of the MOS transistor internally provided. Further, it is necessary to determine the first substrate potential taking into consideration the relation between the threshold voltage and the current drivability.

The prior art shown in FIG. 23 is silent about these relations.

SUMMARY OF THE INVENTION

The present invention was made to solve the above described problem and its object is to provide a semiconductor device in which current consumption in the standby state can be made smaller and the speed of operation in the active state can be increased.

Briefly stated, the semiconductor device of the present invention includes a semiconductor substrate, a MOS transistor, and a substrate bias potential generator. The MOS transistor on the substrate operates selectively in active and standby states. The substrate bias potential generator is responsive to a control signal designating operation of the transistor (1) in the standby state to apply to the substrate a bias potential of a magnitude selected to minimize leak current of the transistor and (2) in the active state, to apply to the substrate a bias potential of a magnitude selected to maximize drivability of the transistor.

In operation, in the standby state, by applying a bias potential having the magnitude selected to minimize the leak current of the transistor, the PN junction is set to a deep reverse bias, and the threshold voltage of the transistor can be enlarged. Therefore, leak current can be reduced. Meanwhile, in the active state, by applying a bias voltage having the magnitude selected to maximize the current drivability of the transistor to the substrate, the threshold voltage of the transistor is reduced, and the resistance at the state transition of the transistor can be reduced. Therefore, the speed of operation of the transistor can be improved.

According to another aspect, the semiconductor device of the present invention includes a semiconductor substrate, an MOS transistor and a substrate bias potential generator. The MOS transistor on said substrate receives first and second operating potentials and operates selectively in active and standby states. The substrate bias potential generator is responsive to a control signal designating operation of the transistor (1) in the standby state to apply to said substrate a bias potential (Vbb) of a magnitude selected to minimize leak current of the transistor, and (2) in the active state, to apply to said substrate the second operating potential.

In operation, in the active state, by applying the second operating potential to the substrate, the drivability of the transistor can be increased, and therefore the speed of operation of the transistor and hence of the semiconductor device can be improved.

According to a further aspect, the semiconductor device of the present invention includes a semiconductor substrate, a MOS transistor and a substrate bias generator.

The MOS transistor on the substrate receives first and second operating potentials and operates selectively in active and standby states. The substrate bias potential generator is responsive to a control signal designating operation of the transistor (1) in the standby state to apply to said substrate a bias potential (vbb) of a magnitude selected to minimize power consumption defined by (a) power consumption of the substrate bias potential generator when the transistor is activated and in the standby state, and (b) power consumption as a result of leakage current of the transistor, and (2) in the active state, to apply to said substrate the second operating potential.

According to yet another aspect of the present invention, the semiconductor device includes a first bias voltage generating device, a second bias voltage generating device and a bias voltage supplying device. The first bias voltage generating device generates a first bias voltage for minimizing the magnitude of leak current in an inactive state of the MOS transistor. The second bias voltage generating device generates a second bias voltage for maximizing the magnitude of supplying current in an active state of the MOS transistor by making shallower the bias than the first bias voltage. The bias voltage supplying device supplies the second bias voltage in place of the first bias voltage semiconductor substrate in response to a signal for making active the MOS transistor.

In operation, in the inactive state, the first bias voltage is supplied to the semiconductor substrate, and in the active state, the second bias voltage is supplied to the semiconductor substrate, and therefore the threshold voltage can be changed. More specifically, by the first bias voltage, the MOS transistor can be biased deeply to increase the threshold voltage and to make smaller the leak current. Thus, power consumption can be reduced. By the second bias voltage, the MOS transistor can be biased shallower, the threshold voltage can be made smaller and the drivability of supplying current can be made larger. By making larger the drivability of supplying current, the resistance at state transition of the MOS transistor can be made small, which increases speed of operation.

According to another aspect of the present invention, the semiconductor device includes a CMOS circuit formed by a MOS transistor of a first conductivity type and a MOS transistor of a second conductivity type, first to fourth bias voltage generating devices and a bias voltage supplying device.

First bias voltage generating device generates a first bias voltage for minimizing the magnitude of leak current in an inactive state of the MOS transistor of the first conductivity type.

The third bias voltage generating device generates a third bias voltage for minimizing the magnitude of leak current in the inactive state of the MOS transistor of the second conductivity type.

The second bias voltage generating device generates a second bias voltage for maximizing the drivability of supplying current in an active state of the MOS transistor of the first conductivity type with the bias made shallower than the first bias voltage.

The fourth bias voltage generating device generates a fourth bias voltage for maximizing the drivability of supplying current in the active state of the MOS transistor of the second conductivity type, with the bias made shallower than the third bias voltage.

The bias voltage supplying device supplies instead of the first bias voltage, the second bias voltage to the well region of the MOSFET of the first conductivity type and supplies, instead of the third bias voltage, the fourth bias voltage to the well region of the MOS transistor of the second conductivity type, in response to a signal for making active the CMOS circuit.

In operation, bias voltage for the inactive state and the bias voltage for the active state are generated for the MOS transistors of the first and second conductivity types constituting the CMOS circuit, and these bias voltages are supplied to the well regions of the MOS transistors. Therefore, the magnitude of leak current in the standby state can be made smaller and the speed of operation in the active state can be increased in the CMOS circuit.

According to a further aspect of the present invention, the semiconductor device includes an buried insulator layer formed on the semiconductor substrate, a semiconductor layer formed on the buried insulator layer, and a MOS transistor formed on the semiconductor device. Further, it includes the first bias voltage generating device, the second bias voltage generating device and the bias voltage supplying device which are similar to those included in the semiconductor device according to the first aspect.

According to this aspect, the invention according to the first aspect is applied to a so called SOI (Silicon- On- Insulator) structure including a semiconductor substrate / a buried insulator layer / a semiconductor layer. Therefore, the magnitude of leak current in the standby state can be made smaller and the speed of operation in the active state can be increased in the SOI structure.

The semiconductor device according to a further aspect of the present invention includes a buried insulator layer formed on a semiconductor substrate, a semiconductor layer formed on the buried insulator layer, and a CMOS circuit including MOS transistors of the first and second conductivity types formed on the semiconductor layer. The semiconductor device further includes a first region, a second region, first to fourth bias voltage generating devices and a bias voltage supplying device. The first region is provided in the buried insulator layer below the MOS transistor of the first conductivity type.

The second region is provided in the buried insulator layer below the MOS transistor of the second conductivity type.

The first bias voltage generating device generates a first bias voltage for determining the magnitude of leak current in the inactive state of the MOS transistor of the first conductivity type.

The third bias voltage generating device generates a third bias voltage for minimizing the magnitude of leak current in the inactive state of the MOS transistor of the second conductivity type.

The second bias voltage generating device generates a second bias voltage for maximizing the drivability of supplying current in the active state of the MOS transistor of the first conductivity type, with the bias made shallower than the first bias voltage.

The fourth bias voltage generating device generates a fourth bias voltage for maximizing the drivability of supplying current in the active state of the MOS transistor of the second conductivity type, with the bias made shallower than the third bias voltage.

The bias voltage supplying device supplies, instead of the first bias voltage, the second bias voltage to the first region, and supplies, instead of the third bias voltage, the fourth bias voltage to the second region, in response to a signal for making active the CMOS circuit.

In this aspect of the present invention, first and second regions are formed in the buried insulator layer in accordance with the third aspect described above, and various voltages are supplied to the first and second regions. By supplying the first bias voltage to the first region and the third bias voltage to the second region, biases of the MOS transistors are made shallower, the magnitude of leak current in the standby state is reduced, and accordingly, power consumption can be reduced. By supplying the second bias voltage to the first region and fourth bias voltage to the second region, the biases of the MOS transistors are made shallower, and accordingly, the speed of operation in the active state can be increased.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 4B shows a change in $I_D$ –$V_G$ characteristic incidental to the change in the substrate bias.

FIG. 24 shows the substrate potential-supply voltage characteristic of the device shown in FIG. 23.

DESCRIPTION OF THE PREFERRED EMBODIMENTS

Figure 1:
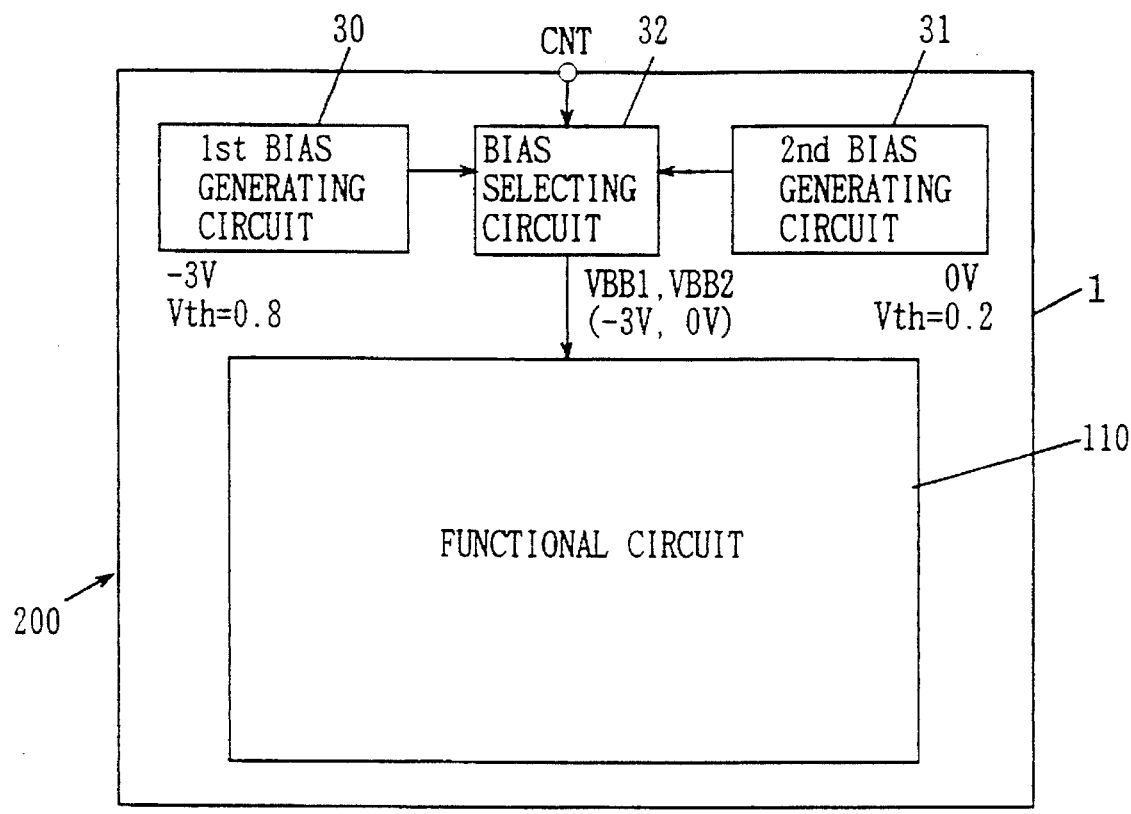
FIG. 1 is a block diagram showing one embodiment of the semiconductor device in accordance with the present invention.

FIG. 1 is a block diagram showing one embodiment of the semiconductor device in accordance with the present invention. Referring to FIG. 1, the semiconductor device 200 includes a functional circuit 110, a first bias generating circuit 30, a second bias generating circuit 31 and a bias selecting circuit 32 formed on a single silicon substrate 1.

Figure 20:
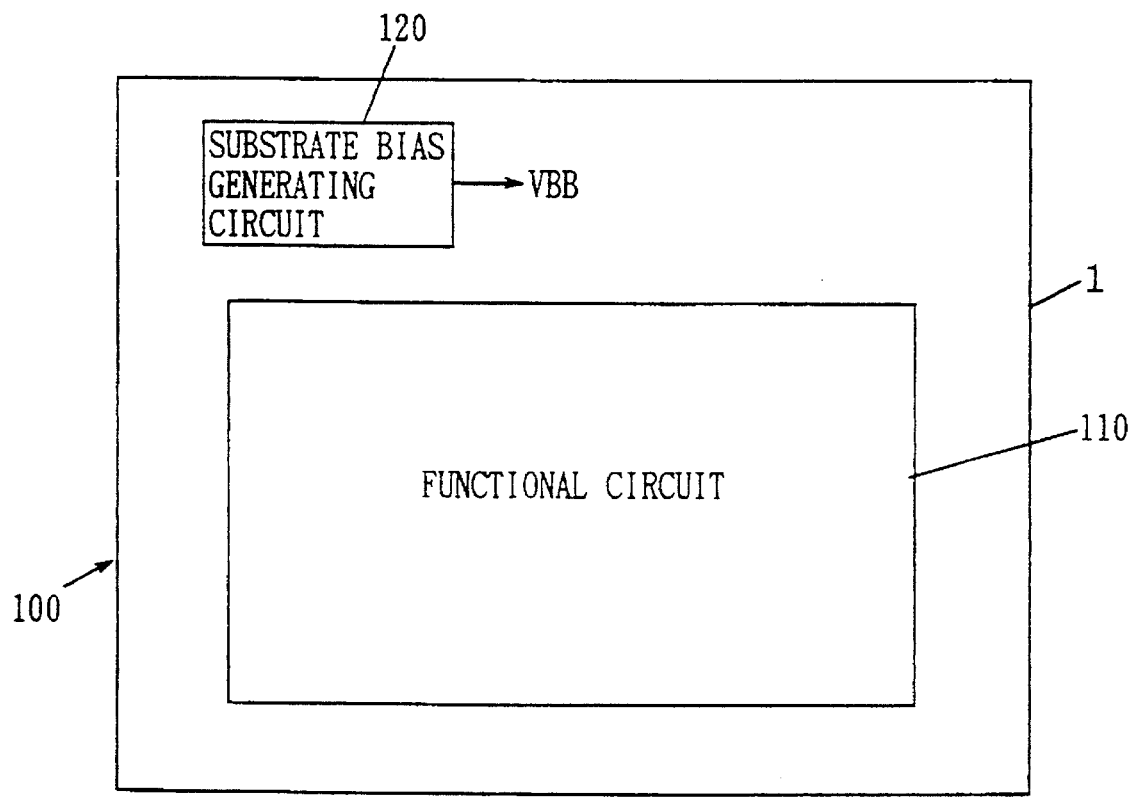
FIG. 20 is a block diagram showing an example of a conventional semiconductor device.

The functional circuit 110 is the same as that shown in FIG. 20. The first bias generating circuit 30 generates a substrate bias VBB1 in the standby state. The substrate bias VBB1 is determined such that the threshold voltage Vth of the NMOS transistor is set to 0.8 V. The potential of the substrate bias VBB1 is related with the drivability of supplying current (mutual conductance) of the NMOS transistor. When the gate width W is 10μm and the gate length L is 1μm, VBB1 is about –3 V. By supplying such deep reverse bias, leak current in the standby state can be minimized.

The second bias generating circuit 31 generates a substrate bias VBB2 in the active state. The substrate bias VBB2 is determined based on the drivability of supplying current in the active state of the NMOS transistor. The drivability of supplying current becomes larger as the threshold voltage Vth becomes smaller, and the drain current flows more easily. In other words, by determining the threshold voltage Vth, the power supply voltage Vdd, the gate width and the gate length, the drivability of supplying current is also determined. In this embodiment, the substrate bias VBB2 is 0 V and the threshold voltage Vth is 0.2 V, and the current supplying drivability is increased by about 30% than the drivability in the standby state.

The bias selecting circuit 32 is connected to the first and second bias generating circuits 30 and 31 and it selects the substrate bias VBB2 generated by the second bias generating circuit 31 in response to a control signal CNT, and applies this to the silicon substrate 1.

Figure 2:
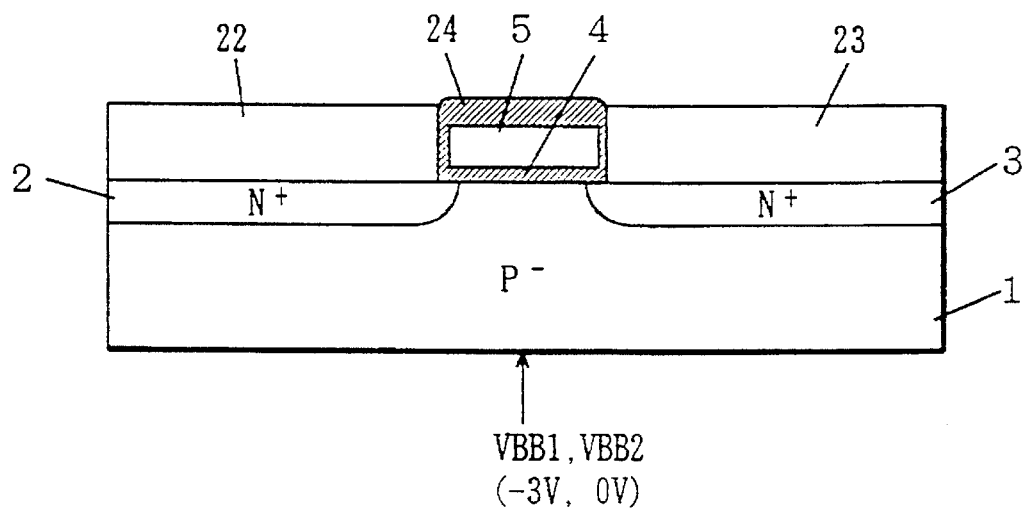
FIG. 2 is a cross section of a portion of the semiconductor device shown in FIG. 1.
Figure 21:
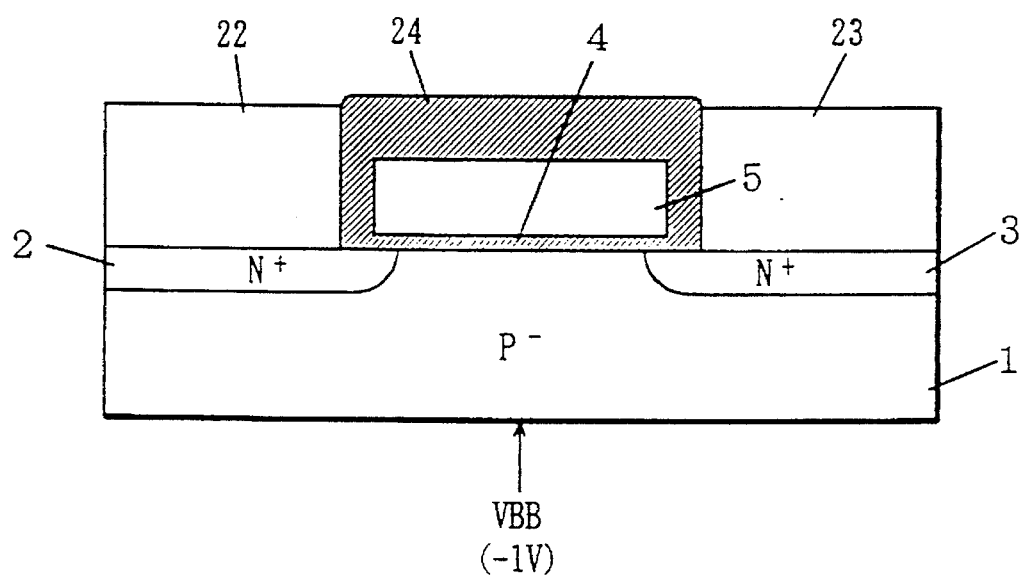
FIG. 21 is a cross section of a portion of the semiconductor device shown in FIG. 20.
Figure 22:
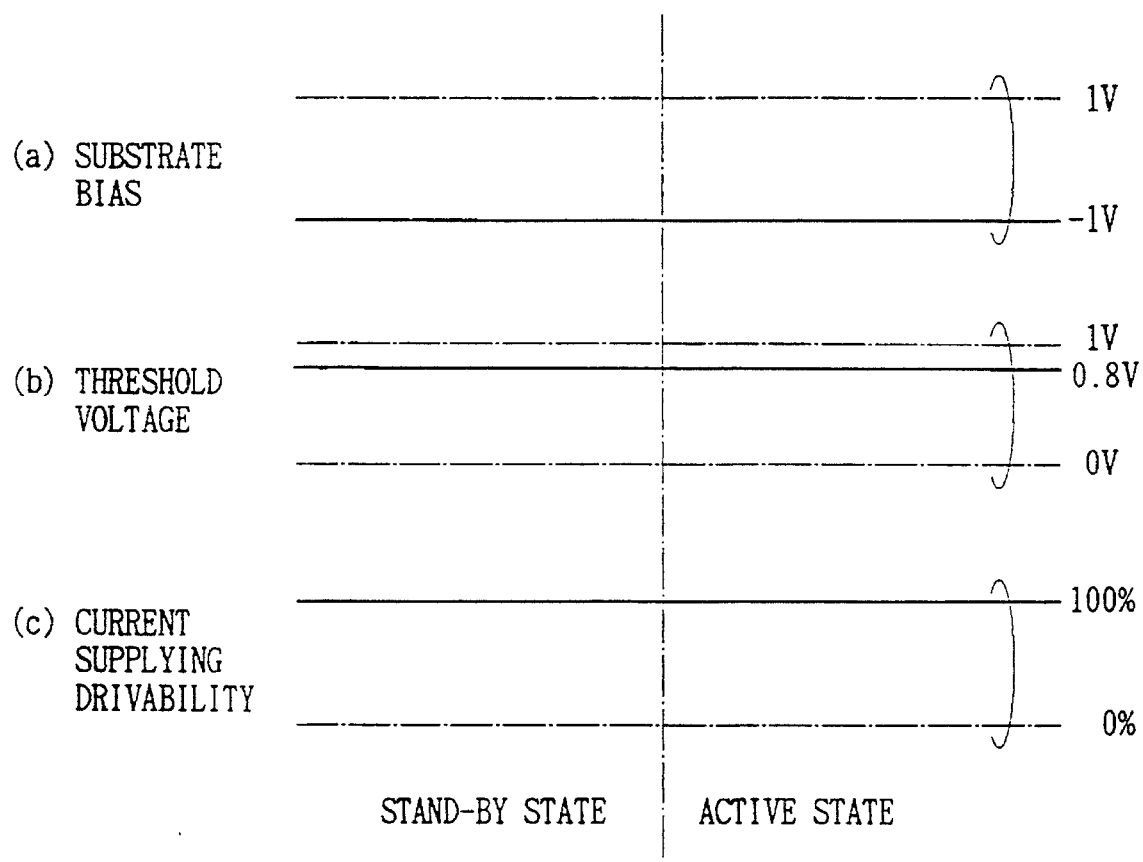
FIG. 22 is a diagram showing a method of supplying substrate bias in the semiconductor device shown in FIG. 20.
Figure 23:
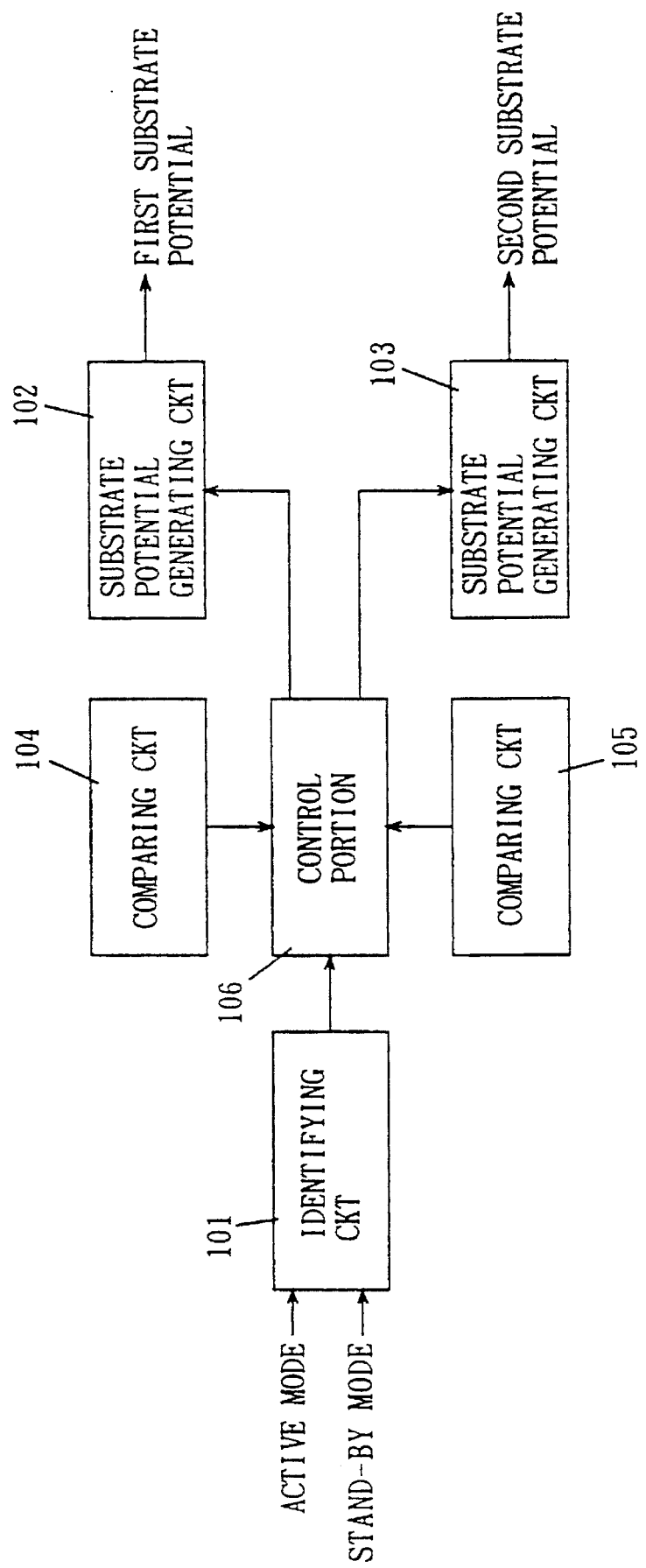
FIG. 23 shows a conventional substrate bias switching device.

FIG. 2 is a cross section of a portion of the semiconductor device shown in FIG. 1. The semiconductor device shown in FIG. 2 differs from the semiconductor device of FIG. 21 in that the substrate bias VBB1 or VBB2 is supplied to the rear surface of the silicon substrate 1. The substrate bias VBB1 is –3 V, and the source region 2 and the drain region 3 of the silicon substrate 1 are deeply reverse-biased.

Figure 3:
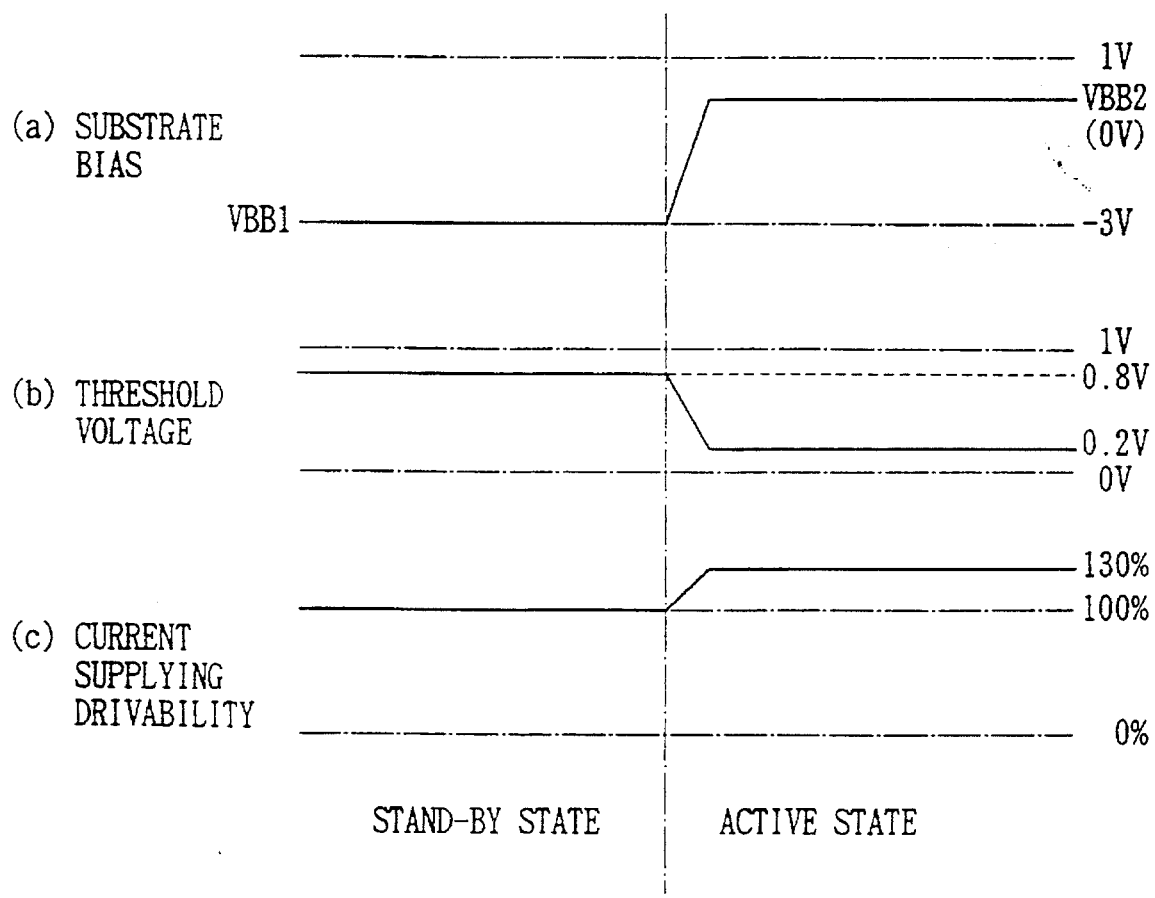
FIG. 3 is an illustration showing changes of the threshold voltage and the drivability of supplying current when the substrate bias is switched.
Figure 4A:
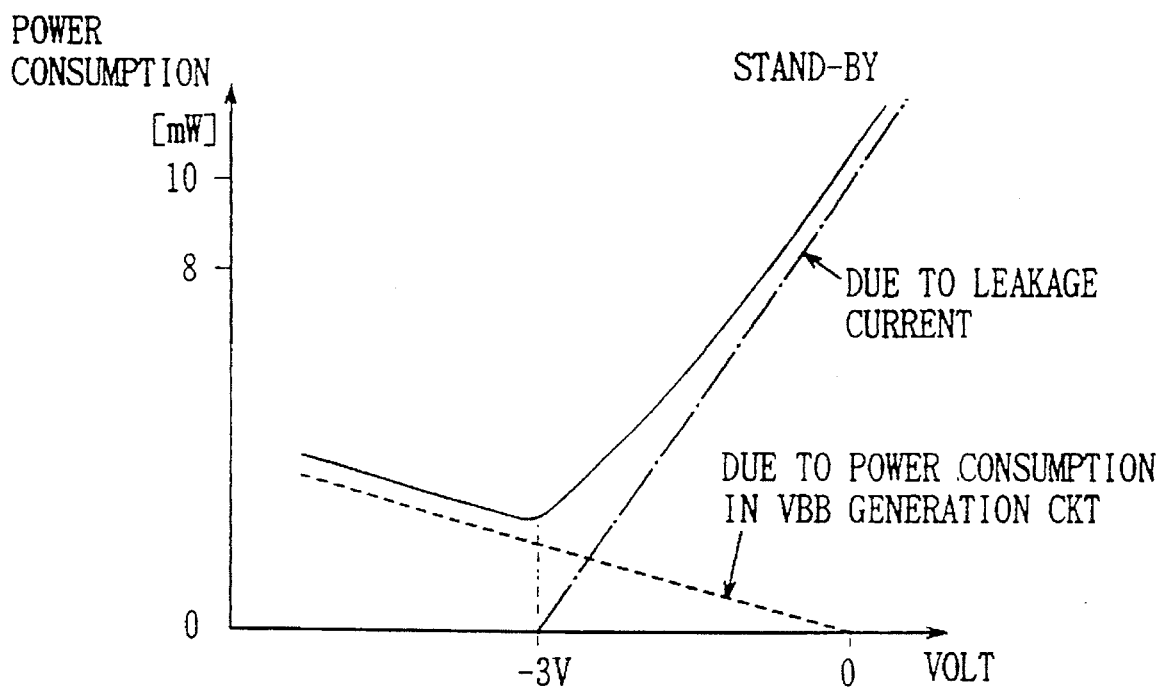
FIG. 4A is a graph showing relation between substrate bias and power consumption.
Figure 5A:
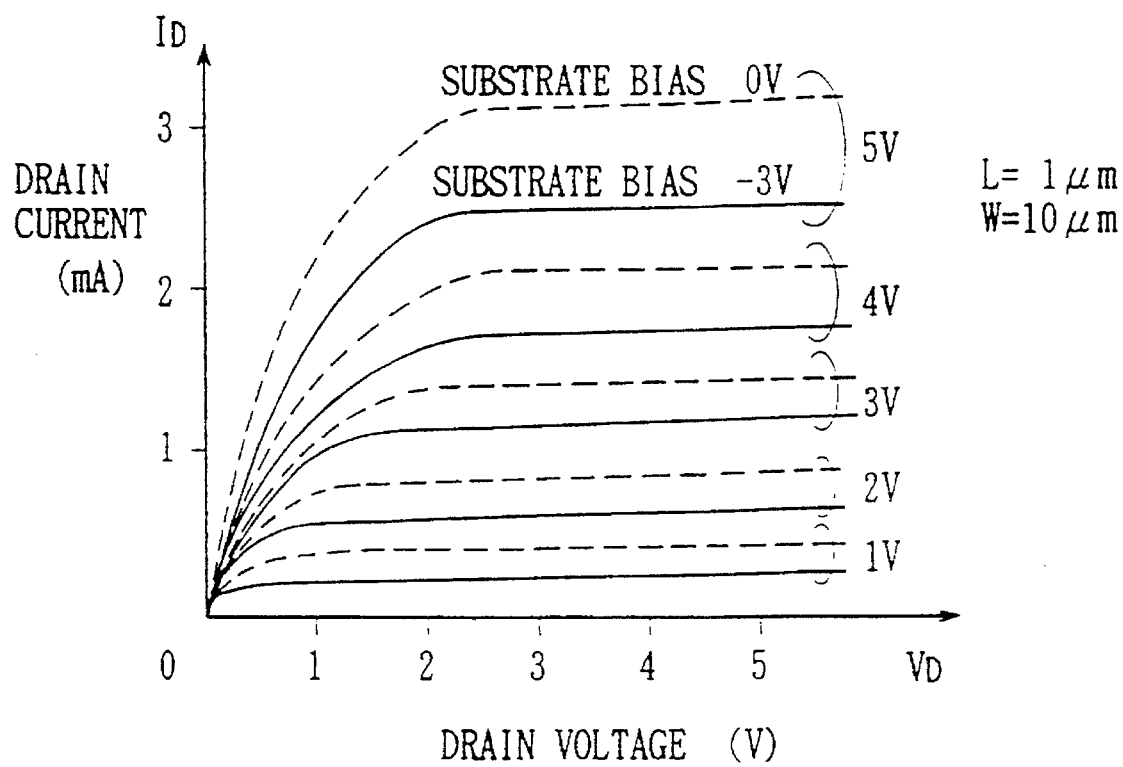
FIG. 5A shows a change in $I_D$ –$V_D$ characteristic incidental to the change in the substrate bias.

FIG. 3 shows changes in the threshold voltage and the drivability of supplying current when the substrate bias is switched from VBB1 to VBB2. FIG. 4A is a graph showing the relation between the substrate bias and power consumption. FIG. 4B shows changes in the $I_D$ –$V_G$ characteristic incidental to the,change of the substrate bias. FIG. 5A shows changes in the $I_D$ –$V_D$ characteristic incidental to the change of the substrate bias.

Referring to FIG. 4A, the most appropriate voltage of the substrate potential VBB1 in an MOS transistor having the gate width W of 10 µm and the gate length L of 1 µm will be described. In the present invention, the substrate bias VBB1 is determined mainly based on the relation between the power consumption of the first bias generating circuit 30 itself and the amount of leak current. In FIG. 4A, the dotted line represents power consumption when the substrate bias VBB1 generated by the first bias generating circuit 30 is changed, and one-dotted line represents the magnitude of leak current when the substrate bias VBB1 is changed. The power consumption at the standby state corresponds to the sum (the solid line of FIG. 4A) of the power consumption by the first bias generating circuit 30 itself and the power consumption caused by the leak current.

Therefore, the most suitable substrate bias is −3 V at which the sum of the power consumption becomes minimum.

Referring to FIG.4B, the solid line shows the $I_D$-$V_G$ characteristic when the substrate bias is set to VBB1 (=−3 V), while the dotted line represents the $I_D$-$V_G$ characteristic when the substrate bias is set to VBB2 (=0 V). Here, the threshold voltage Vth is defined by the gate voltage when a drain current of $10^{-6}$ A flows. Since the magnitude of leak current when the gate voltage $V_G$ at the standby state is set to 0 V is set to be not higher than $10^{-14}$ A, the threshold voltage Vth when the substrate bias VBB1 (=−3 V) is applied to the substrate becomes 0.8 V. Therefore, the ratio of the threshold value Vth with respect to the supply voltage Vcc is increased, and the speed of operation is decreased. Therefore, by setting the substrate bias VBB2 at 0 V in the active state, the threshold voltage Vth is lowered to 0.2 V so as to reduce the ratio of the threshold voltage Vth with respect to the supply voltage vcc, and thus the speed of operation can be improved. The value of 0 V enables increase of drivability of the transistor at the active state.

When substrate bias VBB1 is supplied, that is, at the standby state, when the gate voltage becomes lower than 0.8 V, the drain current reduces exponentially, and when the gate voltage is 0 (off state), the current lowers to the lowest level and the NMOS transistor is at the cut-off state. Therefore, power consumption can be sufficiently reduced at the standby state.

As the LSI technique has been developed, MOS transistors have been miniaturized, and in a 5 V system, the gate length is 0.8 µm, and in a 3 V system, the gate length is 0.5 µm. In a 1.5 V system which will be manufactured in the future, the gate length is expected to be 0.15 µm. However, the threshold voltage at the standby state is constant because of the transistor characteristic, and therefore in the 1.5 V system, even when Vth can be reduced to 0.5 V, the ratio of the threshold voltage Vth with respect to the operating voltage will be as high as 33%. Therefore, the method of reducing the threshold voltage by changing the substrate bias shown in FIG. 4B becomes very effective.

Figure 5B:
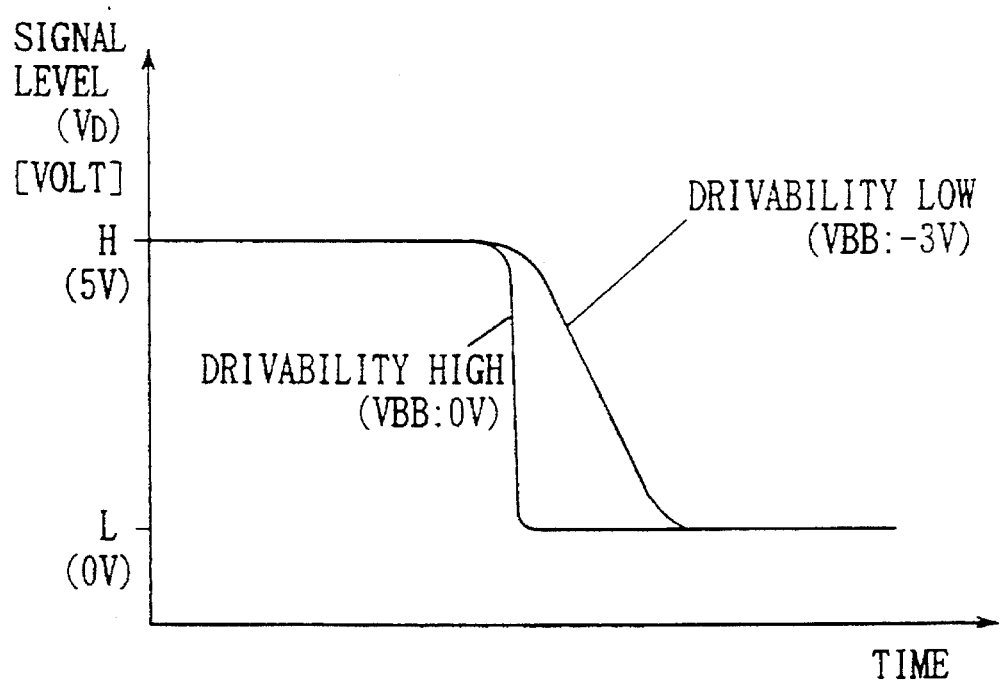
FIG. 5B shows improvement of the speed of operation with respect to the change in the substrate bias.

Referring to FIG. 5A, the solid line represents the $I_D$-$V_D$ characteristic when the substrate bias VBB(−3 V) is supplied, while the dotted line represents the $I_D$-$V_D$ characteristic when the substrate bias VBB2(0 V) is supplied. From this figure, it can be seen that the speed of rise is improved when the substrate bias VBB2 is supplied as shown in FIG. 5B.

The operation of the semiconductor device shown in FIGS. 1 and 2 will be described with reference to FIG. 3.

In the standby state, since the substrate bias VBB1 is supplied to the silicon substrate 1, the threshold voltage Vth is 0.8 V, and the current supplying drivability is 100% as in the conventional example. In this state, the silicon substrate 1, the source region 2 and the drain region 3 are deeply reverse-biased, which can minimize the amount of leak current.

Then the aforementioned control signal CNT is applied to the bias selecting circuit 32 for switching the NMOS transistor from the standby state to the active state. In response to the control signal CNT, the bias selecting circuit 32 selects the substrate bias VBB2 instead of the substrate bias VBB1. Consequently, the reverse-bias between the silicon substrate 1 and the source region 2, and between the substrate and the drain region 3 becomes shallower, the threshold voltage Vth attains to 0.2 V, the current supplying drivability is increased to about 130%, and the resistance between the drain region and the source region is made smaller. When a positive voltage is supplied to the gate electrode 5 in this state, the channel region is quickly inverted to the N type, which increases the speed of operation.

As the threshold voltage Vth lowers, the amount of current increases as shown in FIGS. 3 and 5. Namely, the leak current in the active state is increased to $10^{-9}$A ($V_G$=0 V). However, power consumption in the active state is not determined by the amount of leak current but by the current charging/discharging the capacitors of the circuit. Therefore, the increase in the power consumption is neglectable. Therefore, by changing the substrate bias in the standby state and in the active state, the power consumption in the standby state can be reduced, and the speed operation in the active state can be improved.

Although an NMOS transistor is used in the embodiment shown in FIGS. 1 to 5, the similar operation is done in a PMOS transistor. More specifically, if the substrate bias is reduced from 8 V to 5 V and the threshold voltage is changed from 4.2 V to 4.8 V, the drivability of supplying current is improved and the speed of operation is increased. This corresponds to an example in which a supply voltage in the rage of 0 to 5 V is used. If a supply voltage in the rage of −5 to 0 V is used, the change of the substrate bias is 3 V to 0 V, and the threshold voltage changes from −0.8 V to −0.2 V. More specifically, in the PMOS transistor, the substrate bias changes in the direction of the drain bias, as viewed from source bias. The change of the threshold voltage is in the direction of the source bias.

Figure 6:
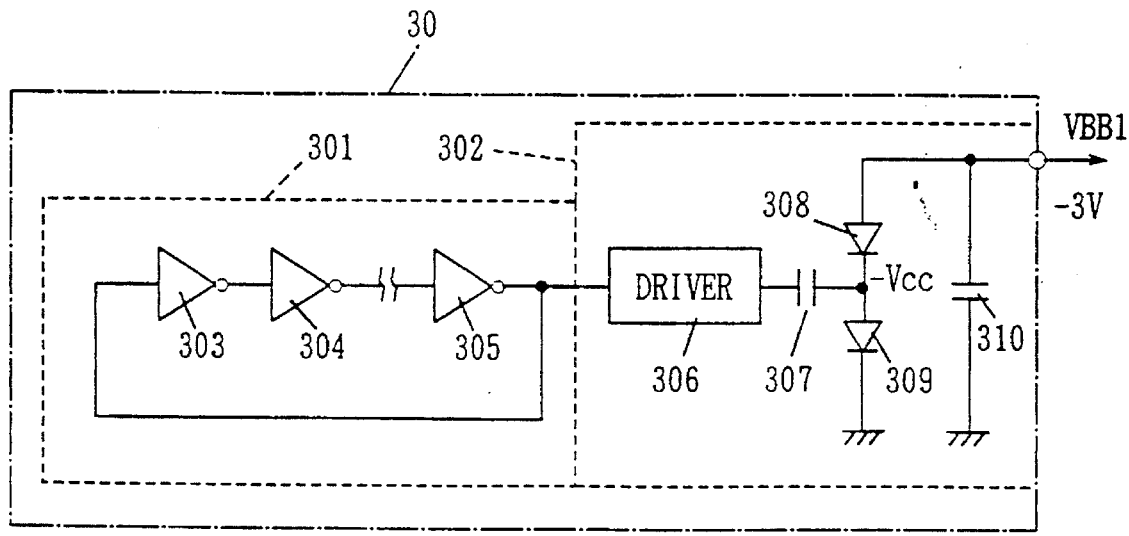
FIG. 6 is a schematic diagram showing an example of the first bias generating circuit shown in FIG. 1.

FIG. 6 is a schematic diagram showing the first bias generating circuit shown in FIG. 1. Referring to FIG. 6, the first bias generating circuit 30 includes a ring oscillator 301 and a charge pump circuit 302. The ring oscillator 301 includes a plurality of cascade connected invertors 303, 304 and 305. The ring oscillator 301 oscillates when the output is fed back to the input, and generates a signal of a prescribed frequency. The charge pump circuit 302 includes a driver 306, capacitors 307 and 310, and diodes 308 and 309. The driver 306 amplifies the signal of a prescribed period from the ring oscillator 301 and applies the amplified signal to one end of the capacitor 307. When the output from the driver 306 lowers from the supply potential to the ground potential, the voltage at the other end of the capacitor 307 also lowers. When the diode 309 is turned on, the discharging path of the capacitor 307 is cut off, and because of the negative charges discharged from the capacitor 307, the potential at the other end of the capacitor 307 is further lowered, to finally reach the negative potential (−Vcc) having the same absolute value as the supply potential Vcc. As a result, the diode 308 is turned on, and the substrate bias VBB1 attains −Vcc +Vth, where Vth is the threshold voltage of the diode 308. By providing a plurality of diodes 308, the substrate bias VBB1 is made to have a desired potential (−3 V).

Figure 7A:
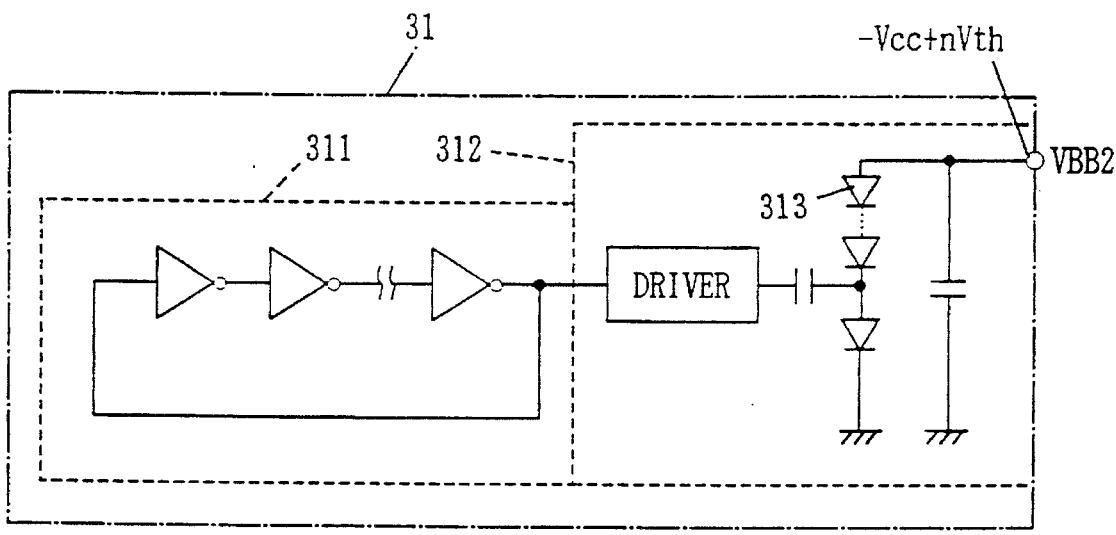
FIG. 7A is a block diagram showing an example of the second bias generating circuit shown in FIG. 1.
Figure 7B:
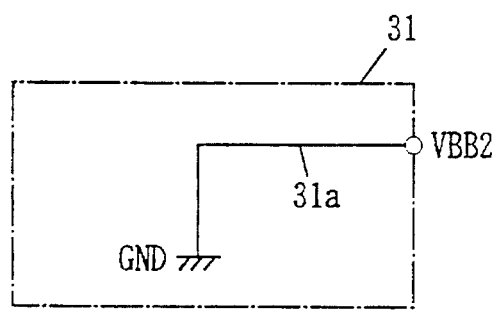
FIG. 7B is a block diagram showing another example of the second bias generating circuit shown in FIG. 1.

FIG. 7A and FIG. 7B are schematic diagrams showing examples of the second bias generating circuit 31 shown in FIG. 1. Referring to FIG. 7A, the circuit differs from that of FIG. 6 in that a diode 313 is added to the charge pump circuit 312. As described with reference to FIG. 6, the substrate bias VBB2 is made to have a desired potential (−1 V to 0 V) by increasing the number of diodes.

Referring to FIG. 7B, the substrate bias generating circuit 31 includes a ground terminal GND and an interconnection 31a connected between the ground terminal GND and a substrate bias output terminal VBB2. By the substrate bias generating circuit 31, the substrate bias (0 V) at the active state can be generated by the simplest structure.

Figure 8:
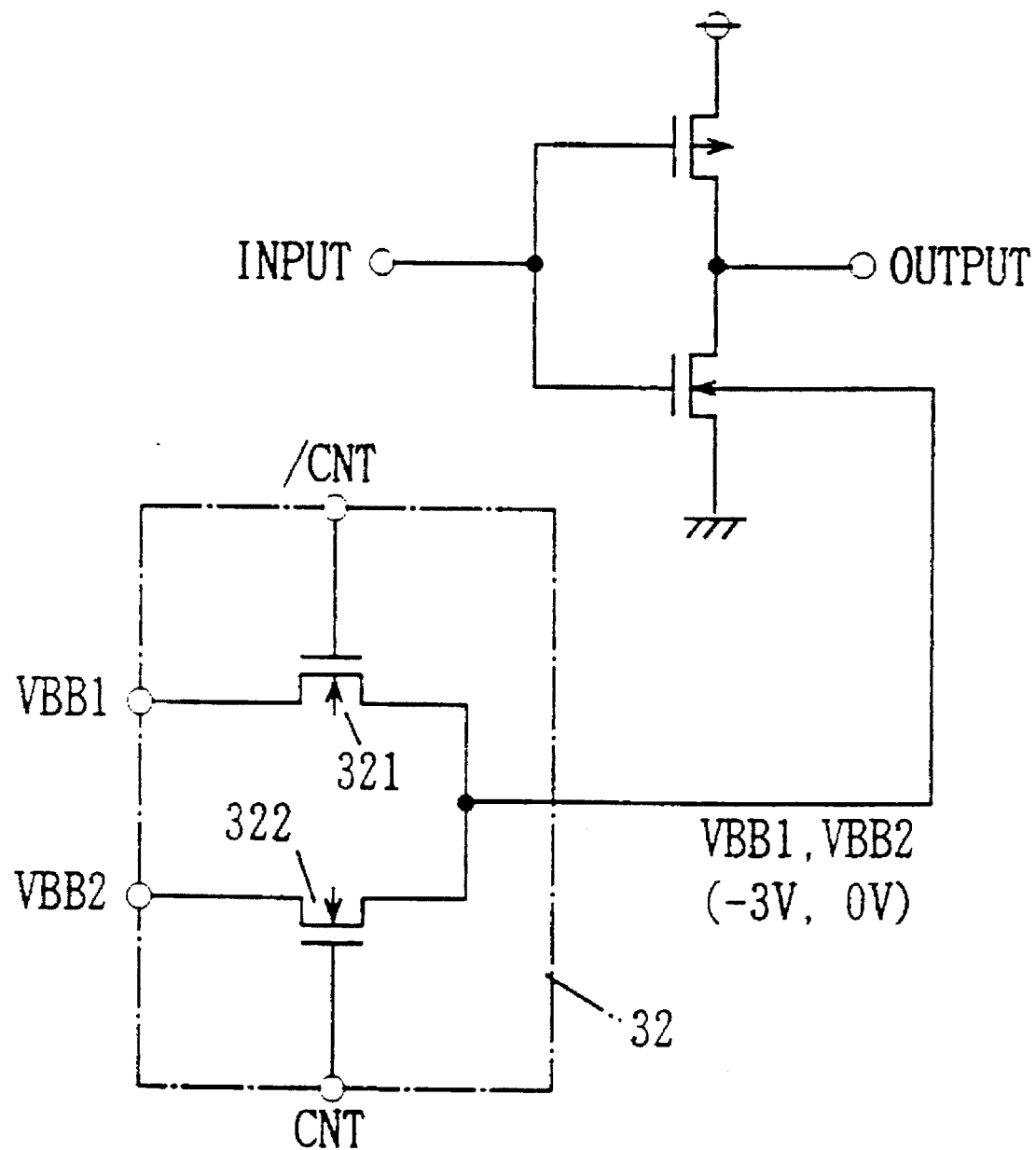
FIG. 8 is a schematic diagram showing an example of the bias selecting circuit shown in FIG. 1.

FIG. 8 is a schematic diagram showing an example of the bias selecting circuit 32 shown in FIG. 1. Referring to FIG. 8, the bias selecting circuit 32 includes NMOS transistors 321 and 322. The NMOS transistor 321 has its source connected to receive the substrate bias VBB1, its drain connected to the silicon substrate 1 together with the drain of the NMOS transistor 322, and its gate connected to receive the control signal/CNT. The NMOS transistor 322 has its source connected to receive the substrate bias VBB2, and its gate connected to receive the signal CNT.

In operation, in the standby state, the control signal/CNT is set to the high level, NMOS transistor 321 is turned on, and the substrate bias VBB1 is supplied to the silicon substrate 1. Meanwhile, in the active state, the control signal CNT is set to the high level, the NMOS transistor 322 is turned on, and the substrate bias VBB2 is supplied to the silicon substrate 1. By this simple structure, the substrate bias applied to the silicon substrate 1 can be changed.

In the bias selecting circuit 32 shown in FIG. 8, the substrate bias is changed in response to the control signal CNT. However, in response to the control signal, input signals Din and/Din may be applied to the gates of the NMOS transistors 321 and 322.

Figure 9:
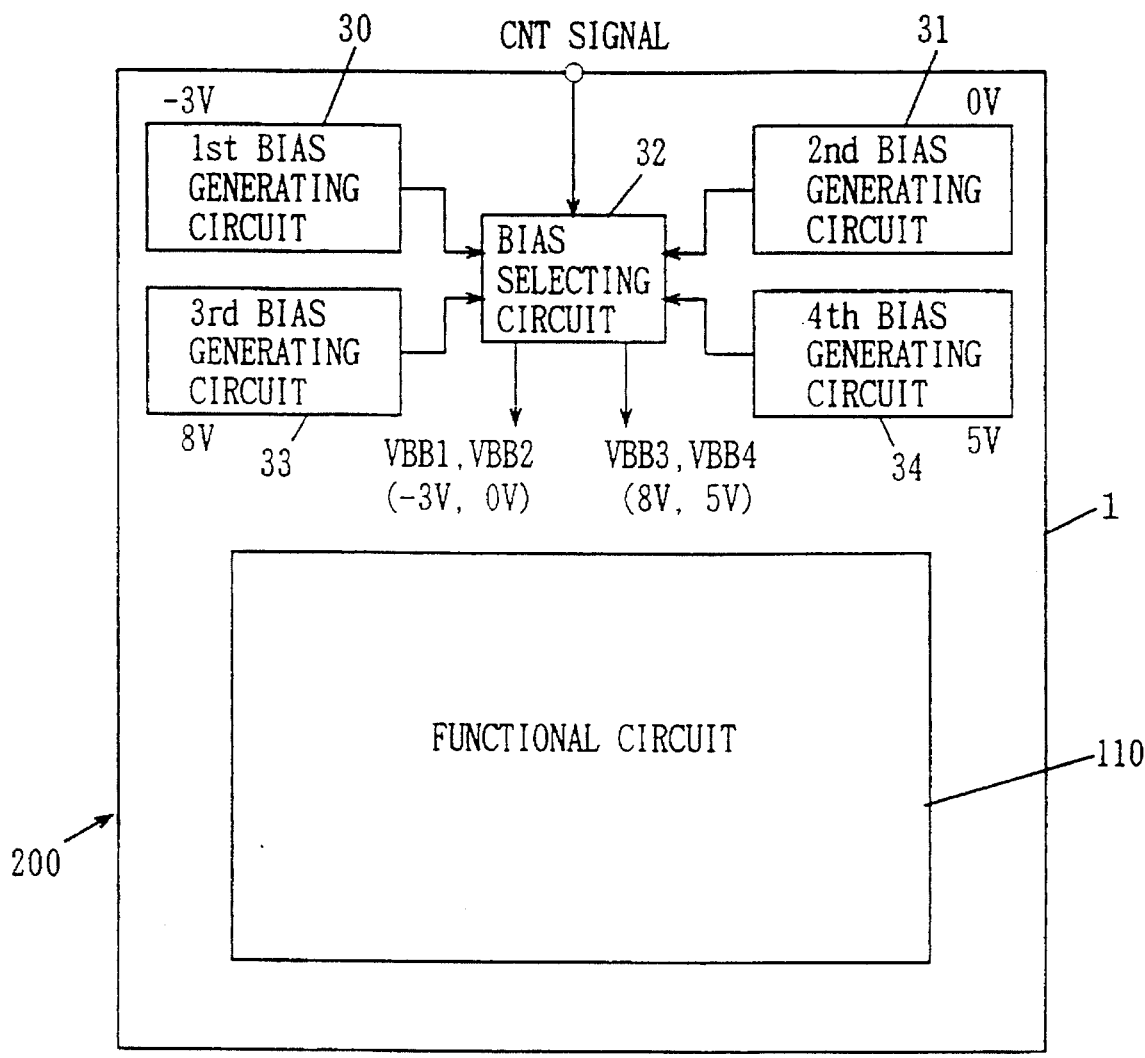
FIG. 9 is a block diagram of a semiconductor device in accordance with another embodiment of the present invention.

FIG. 9 is a block diagram of a semiconductor device in accordance with another embodiment of the present invention. Referring to FIG. 9, the semiconductor device differs from the semiconductor device of FIG. 1 in that a CMOS circuit is included in the functional circuit 110, the third and fourth substrate bias circuits 33 and 34 are added, and a bias selecting circuit 32' for selecting the substrate bias VBB2 or VBB4 are provided. Other circuits are the same as those shown in FIG. 1, and therefore they are denoted by the same reference numerals and description thereof is not repeated.

The third bias generating circuit 33 generates a substrate bias VBB3 in the standby state of the PMOS transistor. The substrate bias VBB3 is set at such a potential as to set the threshold voltage (Vth) of the PMOS transistor at 4.2 V. Specifically, it is about 8 V. By making this such a deep reverse bias, the leak current in the standby state can be reduced.

The fourth bias generating circuit 34 generates a substrate bias VBB4 in the active state of the PMOS transistor. The substrate bias VBB4 is determined based on the dripability of supplying current in the active state of the PMOS transistor. More specifically, it is 5 V. The drivability of supplying current becomes larger when the threshold voltage Vth is smaller. By determining the threshold voltage, the gate width and the gate length, the current supplying drivability is determined. In this embodiment, the substrate bias VBB4 is set to 5 V and the threshold voltage is set to 4.8 V, thus increasing the supplying drivability by about 30%.

Figure 10:
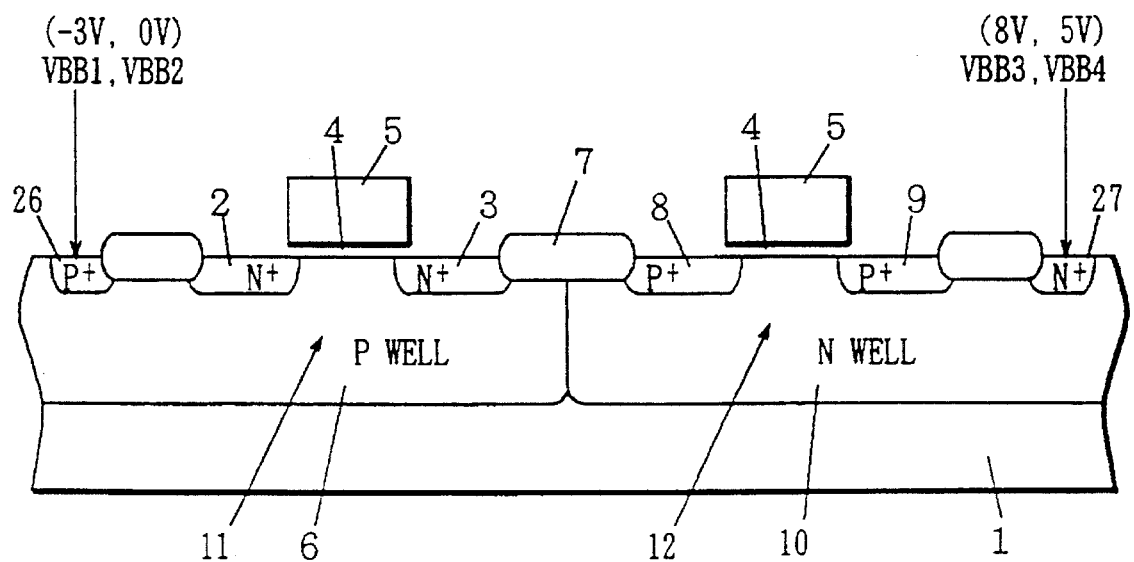
FIG. 10 is a cross section of a portion of the semiconductor device shown in FIG. 9.
Figure 11:
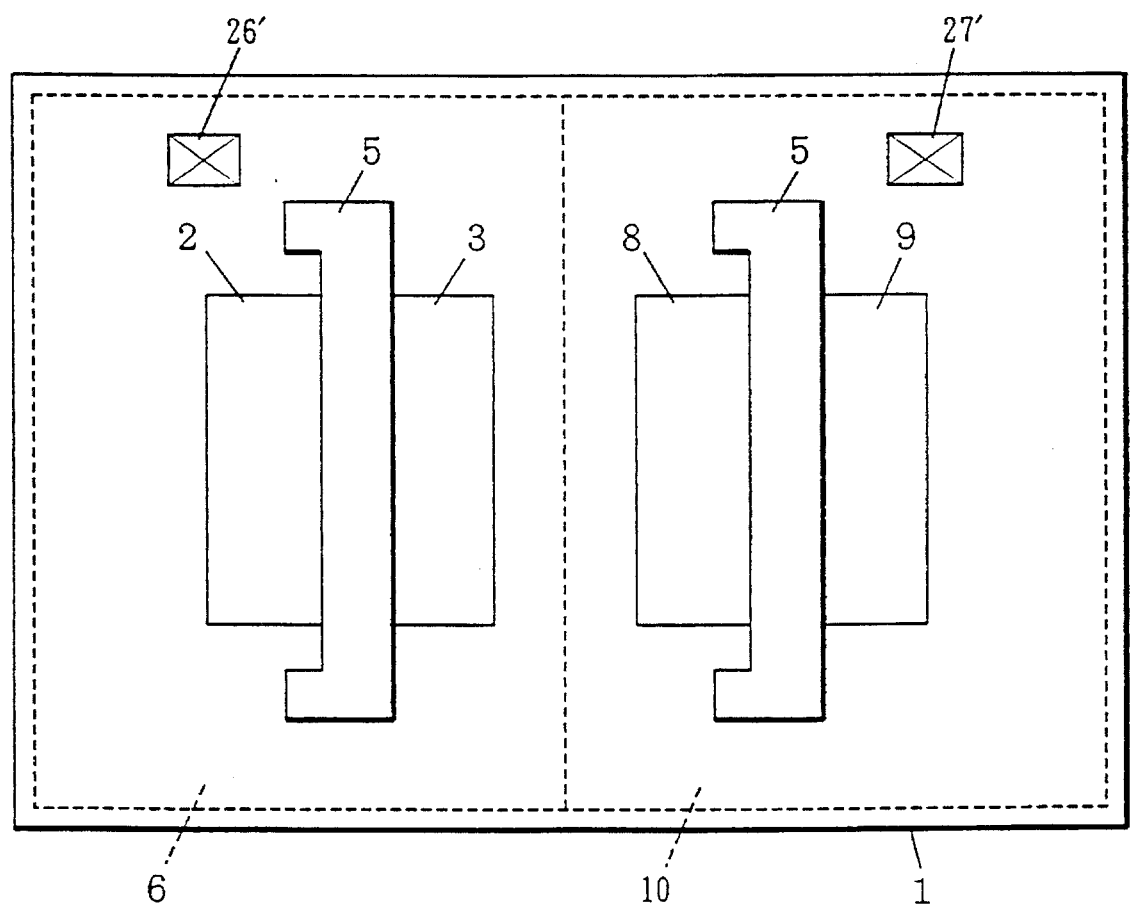
FIG. 11 is a plan view showing a portion of the semiconductor device shown in FIG. 9.

FIG. 10 is a cross section of a portion of the semiconductor device shown in FIG. 9. FIG. 11 is a plan view showing a portion of the semiconductor device shown in FIG. 9. The semiconductor device shown in FIGS. 10 and 11 constitutes a CMOS circuit including an NMOS transistor and a PMOS transistor combined. Referring to FIGS. 10 and 11, the semiconductor device includes a P well 6 doped with P type impurities of $10^{16}$ to $10^{17}/cm^3$ on a silicon substrate 1, an NMOS transistor 11 formed on the P well 6, an N well 10 doped with N type impurities of $10^{16}$ to $10^{17}/cm^3$, for example, a PMOS transistor 12 formed on the N well 10, a well terminal 26 to which the substrate bias VBB1 or VBB2 is supplied, and a well terminal 27 to which the substrate bias VBB3 or VBB4 is supplied. The well terminal 26 is connected to the contact hole 26' shown in FIG. 11, and the well terminal 27 is connected to the contact hole 27' shown in FIG. 11.

Figure 12:
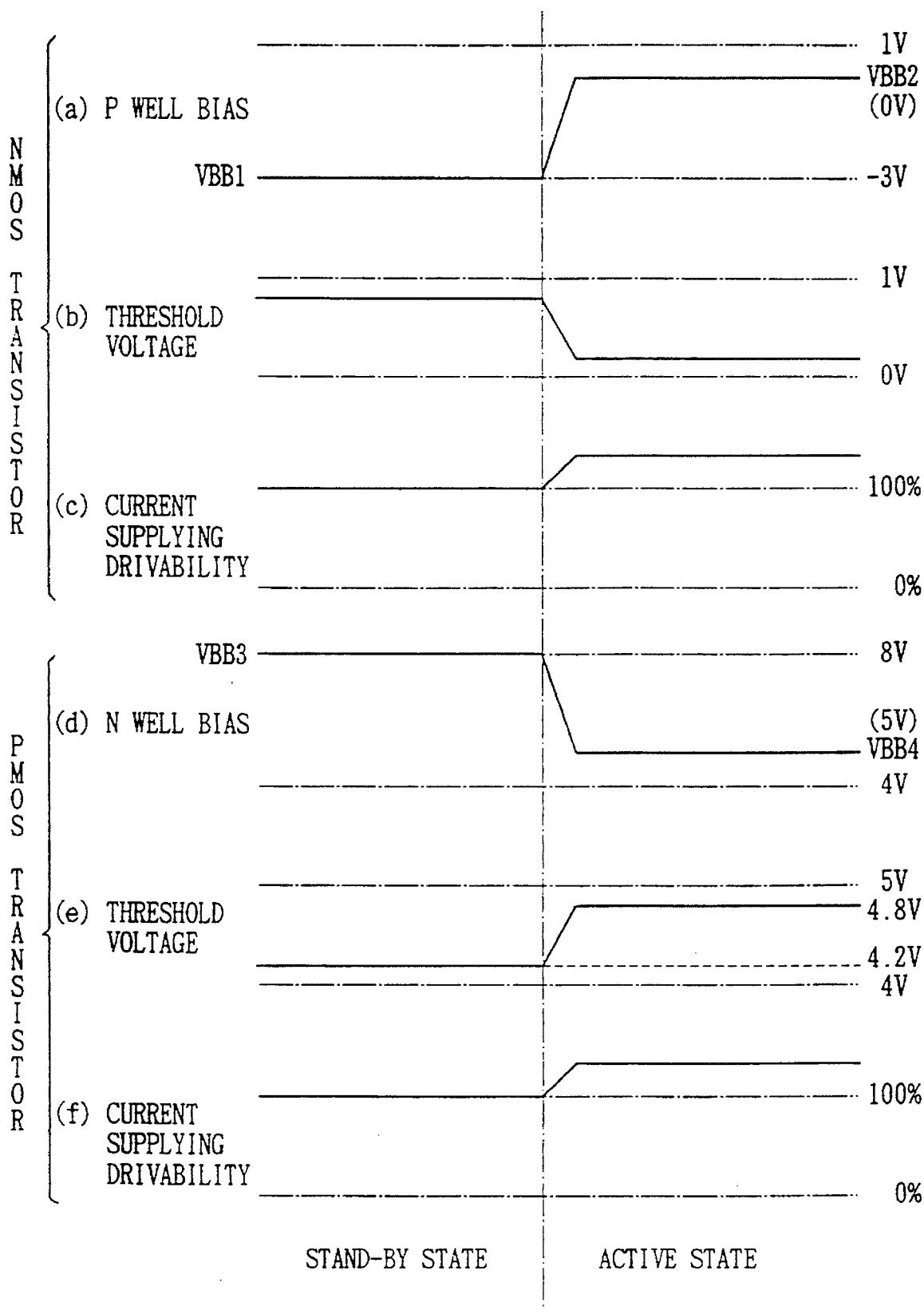
FIG. 12 shows changes in the substrate bias, the threshold voltage and the drivability of supplying current when the semiconductor device of FIG. 9 is switched from the standby state to the active state.

FIG. 12 shows changes in the substrate bias (well bias), the threshold voltage and the drivability of supplying current when the semiconductor device shown in FIG. 9 is switched from the standby state to the active state.

The operation of the semiconductor device shown in FIGS. 9 to 11 will be described with reference to FIG. 12. In the standby state, the well bias VBB1 is supplied to the well terminal 26 and the well bias VBB3 is supplied to the well terminal 27, and therefore the threshold voltages Vth are 0.8 V and 4.2 V, and the drivability of supplying current is 100% as in the prior art. The P well 6 and the source region 2 and the drain region 3 are in the deeply reverse-biased state, and the N well 10 and the source region 8 and the drain region 9 are in the deeply reverse-biased state. Thus the amount of current can be made very small.

Then, in order to activate the CMOS circuit, the signal CNT is supplied to the bias selecting circuit 32'. In response, the bias selecting circuit 32' selects the substrate bias VBB2 instead of the substrate bias VBB1 to apply this to the well terminal 6, selects the substrate bias VBB4 instead of the substrate bias VBB3 and applies this to the well terminal 27. Consequently, the reverse bias between the P well 6 and each of the source and drain regions 2 and 3 as well as the reverse bias between the N well 10 and each of the source and drain regions 8 and 9 are made shallower. Consequently, the threshold voltages Vth are set to 0.2 V and 4.8 V, the current supplying drivability is increased to about 130%, and the resistance between the drain region and the source region is made smaller. When a positive voltage is supplied to the gate electrode 5 in this state, the NMOS transistor 11 is turned on quickly, and the PMOS transistor 12 is turned off quickly. Consequently, the speed of operation is increased.

Figure 13:
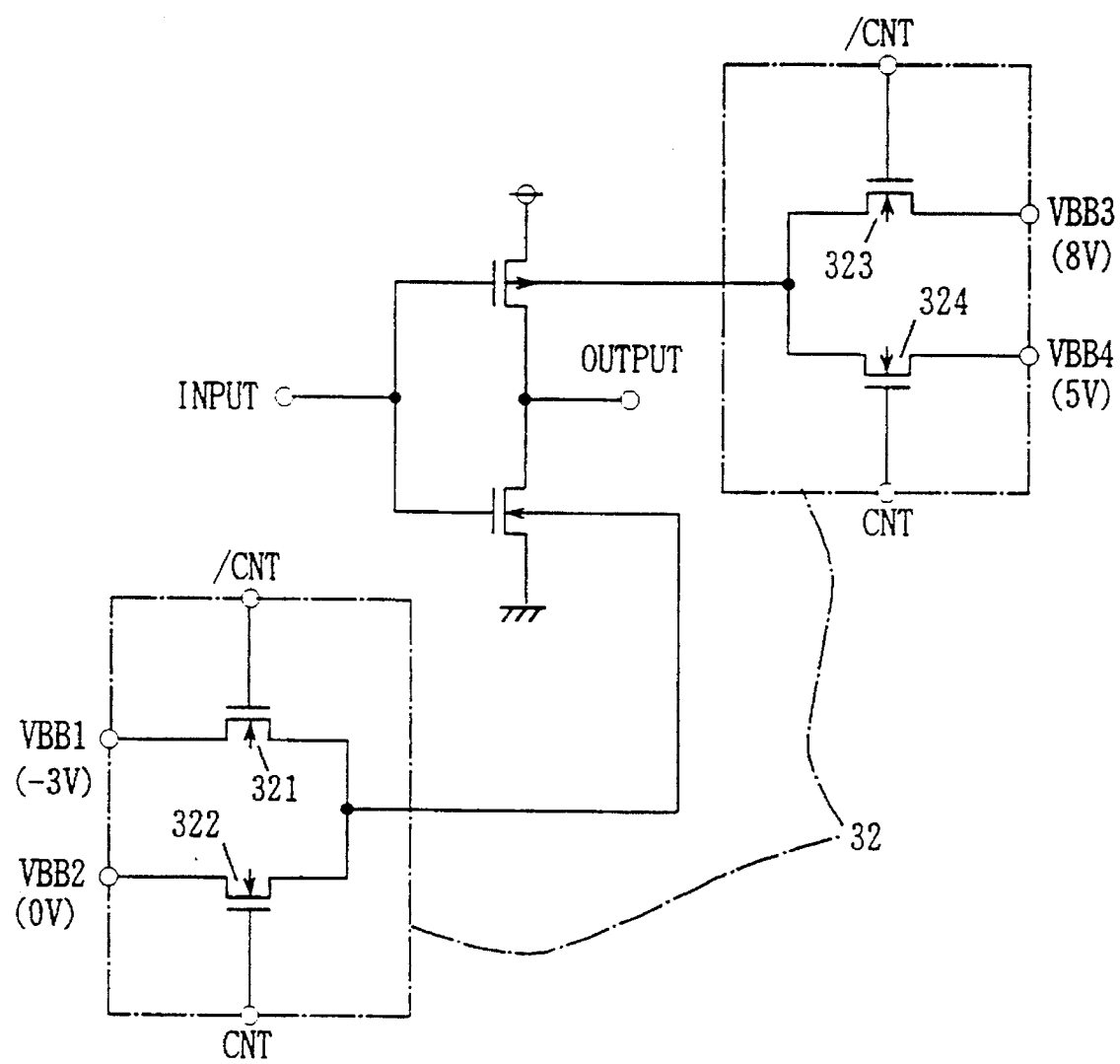
FIG. 13 is a schematic diagram showing an example of the bias selecting circuit shown in FIG. 9.

FIG. 13 is a schematic diagram showing an example of the bias selecting circuit 32' shown in FIG. 9. Referring to FIG. 13, the bias selecting circuit 32' differs from the bias selecting circuit 32 shown in FIG. 8 in that an NMOS transistor 323 responsive to the control signal/CNT for selecting the substrate bias VBB3, and an NMOS transistor 324 responsive to the control signal CNT for selecting the substrate bias VBB4 are added. Other portions are the same as those in FIG. 8.

Figure 14:
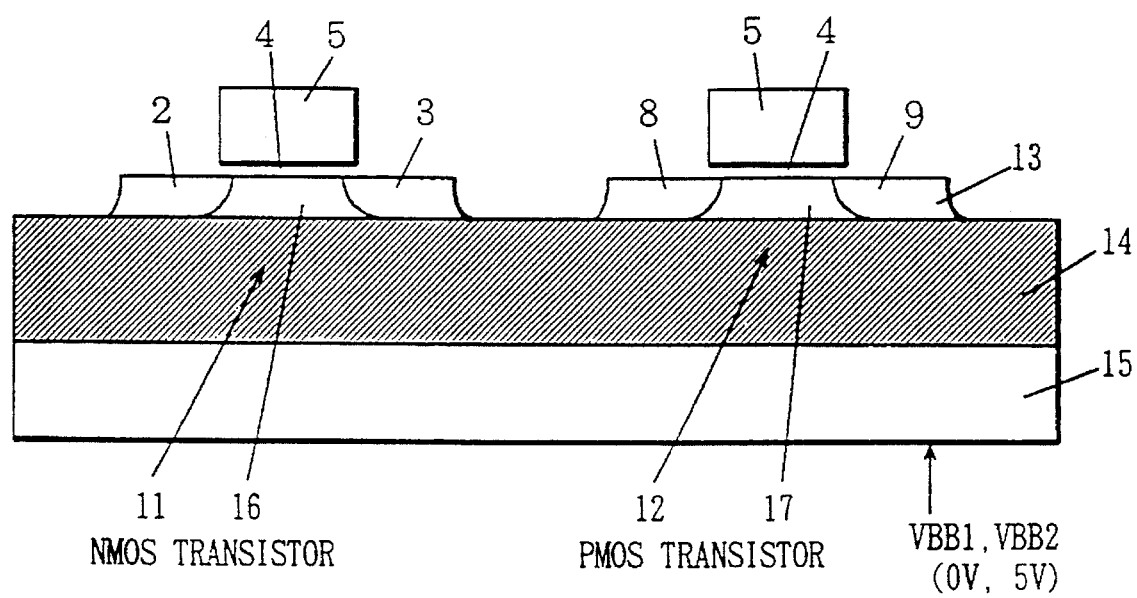
FIG. 14 is a cross section showing a further embodiment of the semiconductor device in accordance with the present invention.

FIG. 14 is a cross section showing a further embodiment of the semiconductor device in accordance with the present invention. The semiconductor device shown in FIG. 14 has a so called SOI structure. Referring to FIG. 14, the semiconductor device includes a buried insulator layer 14 formed on a silicon substrate 15, an NMOS transistor 11 formed on the buried insulator layer 14, and a PMOS transistor 12 formed on the buried insulator layer 14. Such an SOI- MOSFET is formed by the SIMOX (Separation by Implanted Oxygen). More specifically, $2\times10^{18}$ /cm$^2$ of oxygen ions, for example, are implanted to the silicon substrate 15 and thereafter it is heat treated at 1300° C. for 6 hours in Ar atmosphere to provide an SOI substrate including three layered structure of silicon/silicon oxide film/silicon. The silicon layer 13 is processed to be islands, and is divided into the NMOS transistor 11 and the PMOS transistor 12. In each of the NMOS transistor 11 and the PMOS transistor 12, a gate electrode 5 is provided with a gate dielectric thin film 4 interposed as in the conventional device formed on the silicon substrate. In the NMOS transistor 11, an N channel region 16 doped with P type impurities of $10^{16}$ to $10^{17}$/cm$^3$, for example, is provided in the silicon layer 13 below the gate electrode 5, and the source and drain regions 2 and 3 are provided in the similar manner as the prior art on both sides of the N channel region 16.

When the gate voltage is applied to the NMOS transistor 11 to activate the transistor, the N channel region 16 is completely depleted, and the impurity concentration of the N channel region 16 is suppressed low, as mentioned above.

In the PMOS transistor 12, the impurity concentration of the P channel region 17 is made not lower than $10^{17}$/cm$^3$, which is higher than the NMOS transistor 11, and even when the gate voltage is applied, only a portion of the P channel region 17 is depleted. Except this, the PMOS transistor has similar structure as the NMOS transistor, with the type of impurities opposite to that of NMOS transistor.

In the SOI-MOSFET, the substrate biases VBB1 and VBB2 are supplied from the rear surface of the silicon substrate 1. The substrate bias VBB1 is fixed at 0 V so as to set the threshold voltage Vth at 0.8 V, and the potential of the substrate bias VBB2 is 5 V so as to set the threshold voltage Vth at 0.2 V.

Figure 15:
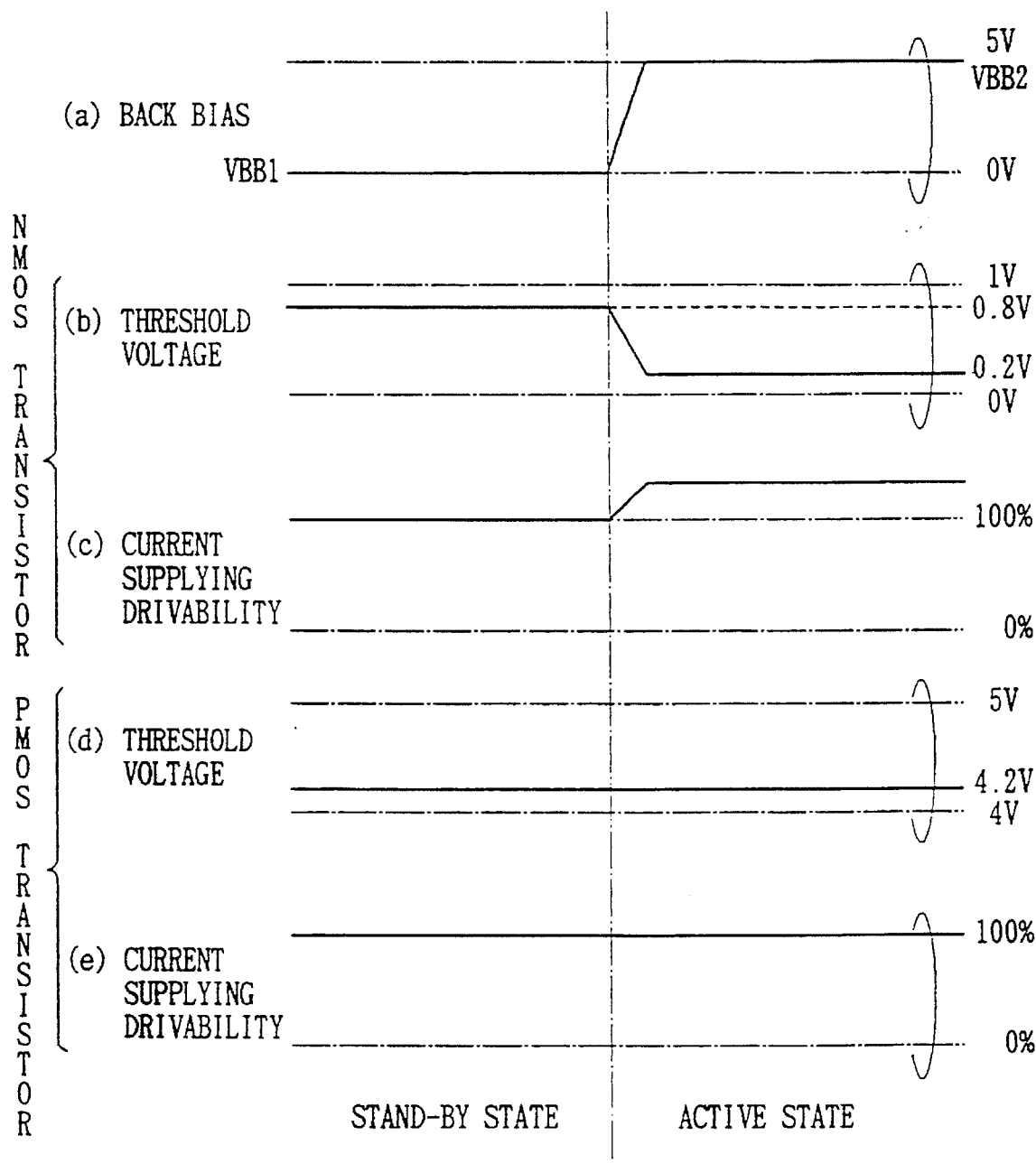
FIG. 15 shows changes in the substrate bias, the threshold voltage and the drivability of supplying current when the semiconductor device of FIG. 14 is switched from the standby state to the active state.

FIG. 15 shows changes in the threshold voltage and the drivability of supplying current when the substrate bias is changed.

The operation of the semiconductor device shown in FIG. 14 will be described with reference to FIG. 15.

The SOI-MOSFET has a MOS structure of silicon substrate 15 / buried oxide layer 14 / silicon layer 13, as viewed from the side of the silicon substrate 15. In other words, MOS structure is formed on both surfaces of the silicon layer 13. The operation when the substrate bias VBB2 (5 V) is applied from the silicon substrate 15 changes dependent on whether the channel region is completely depleted or partially depleted when the voltage is applied to the gate. When the channel region is entirely depleted (in this example, NMOS transistor), the capacitors are coupled in series from the buried oxide film 14 to the gate dielectric thin film 4 (buried oxide layer 14 / silicon layer 13 / gate dielectric thin film 4) (capacitance coupled), and the threshold voltages of the MOS transistors 11 and 12 on the top surface side are changed by the substrate bias. The direction of change of the threshold voltages caused by the substrate bias change is the same as that of the MOS transistor formed on the bulk silicon described above. However, since the bias potential is supplied to the semiconductor layer 13 through the thick buried oxide layer 14, the change becomes smaller.

Let us assume that the channel region is partially depleted, that is, the case of the PMOS transistor. The potential of the channel region which is not depleted is fixed at the potential of the source region 8. Therefore, such a capacitance coupling as occurred when it is fully depleted is not generated. Therefore, the threshold voltage of the MOS on the surface is not influenced by the normal back gate bias.

In the standby state, the back gate bias VBB1 (substrate bias) is fixed at 0 V, and the threshold value is set to suppress current in this state. Thus power consumption can be reduced.

When the back gate bias is increased from VBB1 to VBB2 (5 V) in order to activate the device from the standby state, the threshold value of the NMOS transistor 11 decreases from 0.8 V to 0.2 V, and hence the drivability of supplying current is increased. By this increase of current, the circuit can operate at higher speed. In the PMOS transistor 12, the channel region is partially depleted, and therefore there is no effect of back gate bias, and the threshold value and the drivability of supplying current are not changed.

The PMOS transistor 12 is depleted partially so that it is not influence by the back gate bias, since if the NMOS transistor and the PMOS transistor are both fully depleted tQ be subjected to the back gate bias effect in the SOI-MOSFET, the effects increasing current is reversed in the NMOS transistor and the PMOS transistor. That is, if the back gate bias is applied to increase the current in the NMOS transistor, the drivability of supplying current in the PMOS transistor is reduced.

In the embodiment shown in FIGS. 14 and 15, the NMOS transistor is fully depleted and the PMOS transistor is partially depleted. However, the reverse combination may be available, dependent on the circuit structure. However, if the reverse structure is used, the back gate bias (substrate bias) must be changed in the negative direction, that is, from 5 V to 0 V, for example.

Figure 16:
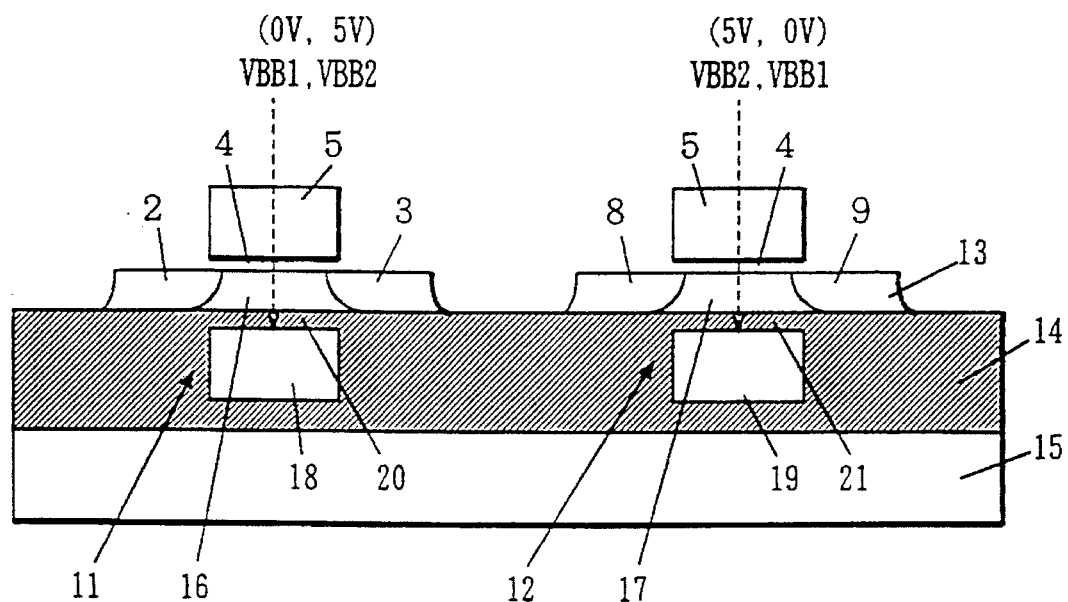
FIG. 16 is a cross sectional view showing a further embodiment of the semiconductor device in accordance with the present invention.
Figure 17:
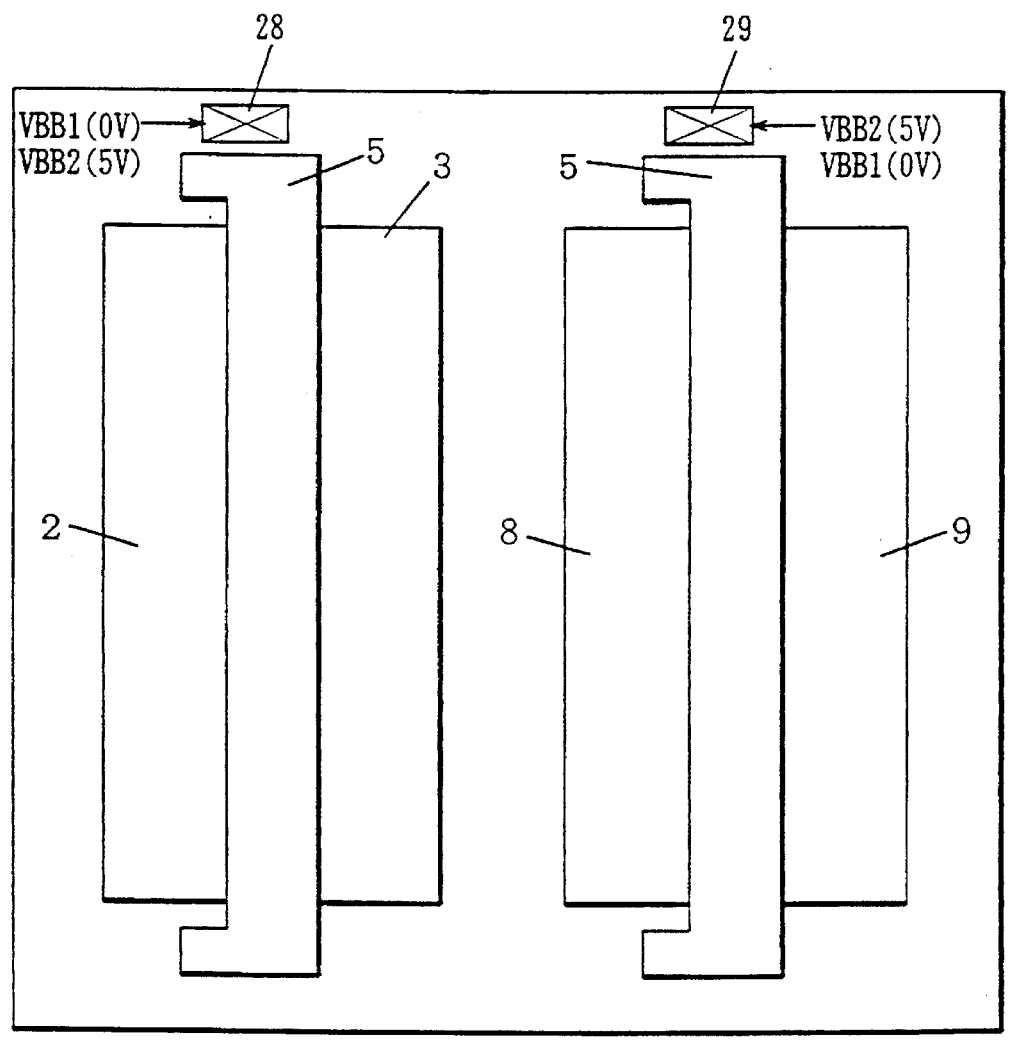
FIG. 17 is a plan view of the semiconductor device shown in FIG. 16.

FIG. 16 is a cross section showing a further embodiment of the semiconductor device in accordance with the present invention, and FIG. 17 is a plan view of the semiconductor device shown in FIG. 16. In the semiconductor device shown in FIGS. 16 and 17, the NMOS transistor and the PMOS transistor are both fully depleted.

The semiconductor device differs from the semiconductor device shown in FIG. 14 in that an NMOS second gate 18 and a PMOS second gate 19 are provided in the buried oxide film layer. The NMOS second gate 18 is provided below the silicon layer 13 of the NMOS transistor 11, and the PMOS second gate 19 is provided below the PMOS transistor 12.

Referring to FIG. 17, on the silicon layer 13, a substrate terminal 28 for receiving substrate biases VBB1 and VBB2 and a substrate terminal 29 for receiving mutually complementary substrate biases VBB1 and VBB2 are provided. The potentials of the substrate biases VBB1 and VBB2 are the same as in the embodiment of FIG. 14 (0 V, 5 V).

Figure 18:
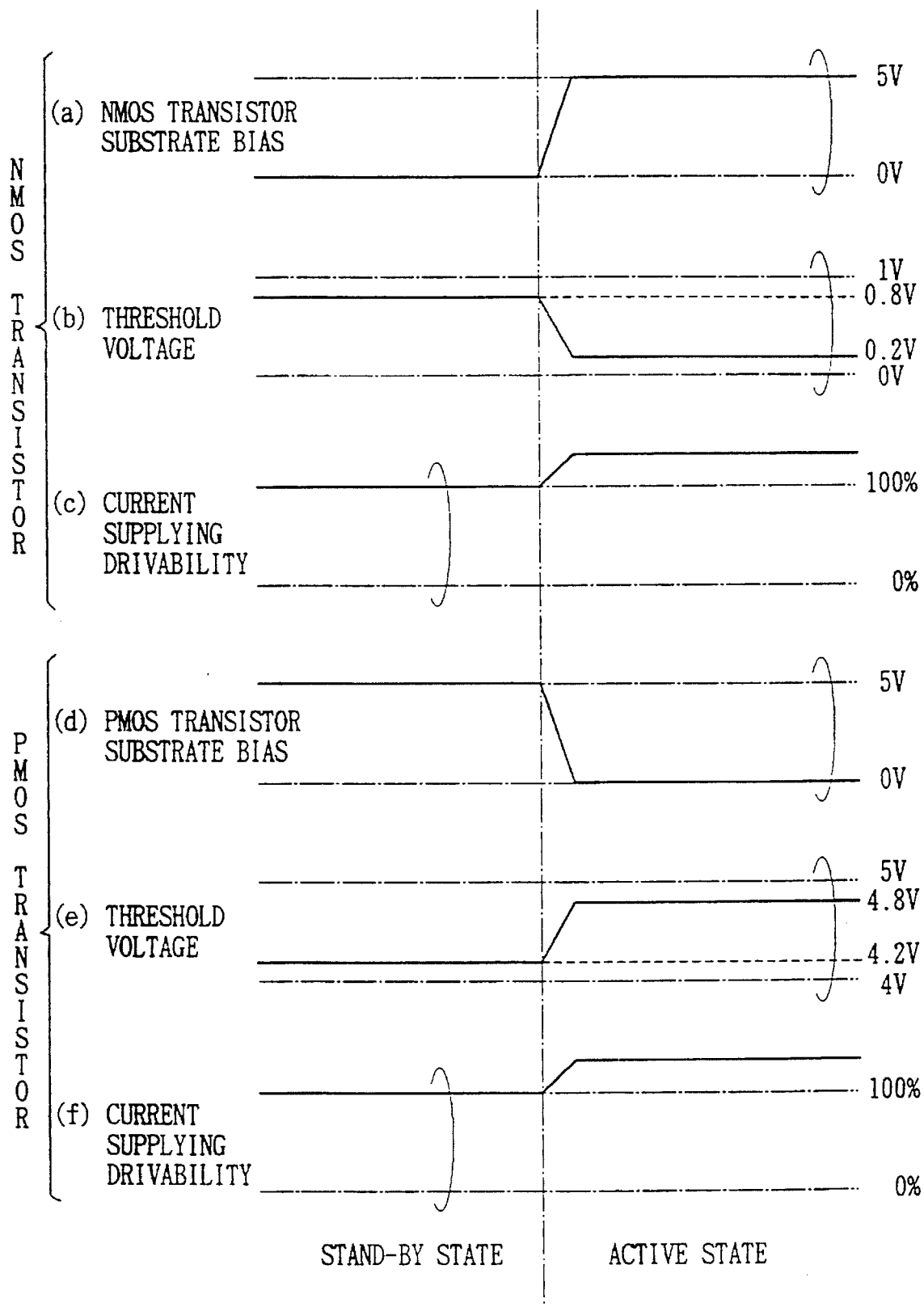
FIG. 18 shows changes in the substrate bias, the threshold voltage and the drivability of supplying current when the device is switched from the standby state to the active state.

FIG. 18 shows changes in the threshold voltage and the drivability of supplying current when the substrate bias is changed.

Referring to FIG. 18, the operation of the semiconductor device shown in FIGS. 16 and 17 will be described.

In the standby state, the substrate bias VBB1 (0 V) is supplied to the NMOS second gate 18 and the substrate bias VBB2 (5 V) is supplied to the PMOS second gate 19 in the standby state. By the application of the substrate biases, the threshold voltage Vth of the NMOS transistor 11 attains 0.8 V, and the threshold voltage Vth of the PMOS transistor 12 attains 4.2 V, resulting in a deep reverse bias. The operation so far is the same as that of the embodiment shown in FIG. 14.

When the device is switched from the standby state to the active state, the substrate bias VBB2 is supplied to the NMOS second gate 18, while the substrate bias VBB1 is supplied to the PMOS second gate 19. By the application of the substrate biases, the threshold voltage of the NMOS transistor 11 attains 0.2 V, while the threshold voltage of the PMOS transistor 12 attains 4.8 V. Thus the drivability of supplying current in the MOS transistors 11 and 12 is increased to about 130%, and consequently, the speed of operation of the CMOS circuit can be increased.

Figure 19:
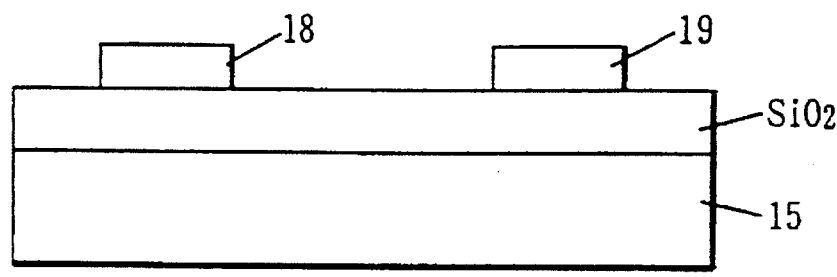
FIGS. 19 (a) –(c) shows a step of forming the SOI structure shown in FIG. 16.
Figure 19:
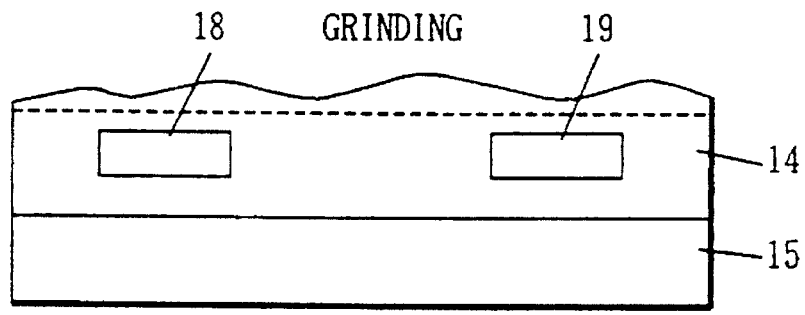
Figure 19:
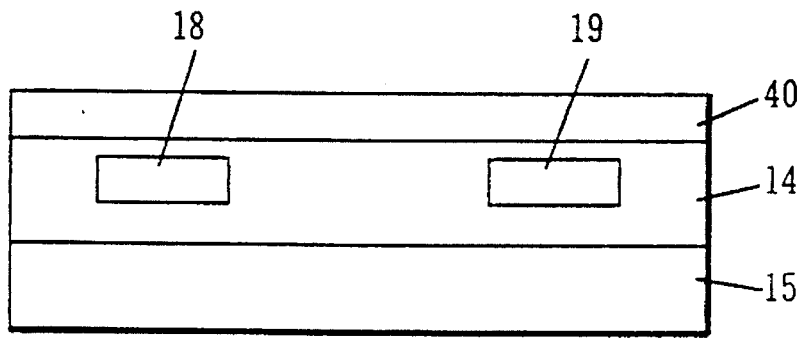

FIG. 19 shows steps for manufacturing the SOI structure shown in FIG. 16. In FIG. 19(a), a silicon oxide film is formed on the silicon substrate 15, and thereafter a polysilicon layer as the second gates 18 and 19 are formed by sputtering or the like.

Then, referring to FIG. 19(b), an oxide film is deposited, and thereafter the silicon oxide film is ground by a prescribed thickness (to the dotted line in the figure).

Then, referring to FIG. 19(c), the silicon layer 40 is deposited.

Although silicon was used for the semiconductor in the embodiments shown in FIGS. 1 to 19, other semiconductor material such as germanium Ge or gallium arsenide GaAs may be used.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device comprising:

a semiconductor substrate having a substrate terminal;

an insulating layer formed on said semiconductor substrate;

a first conductivity channel type MOS transistor formed on said insulating layer and operating selectively in standby and active states, said first conductivity channel type MOS transistor having a gate electrode and a channel forming region which is fully depleted upon application of a threshold voltage thereof;

a second conductivity channel type MOS transistor formed on said insulating layer and operating selectively in the standby and active states, the second conductivity channel type MOS transistor being in the standby state when the first conductivity channel type MOS transistor is in the standby state and the second conductivity channel type MOS transistor being in the active state when the first conductivity channel type MOS transistor is in the active state, said second conductivity channel type MOS transistor having a gate electrode and a channel forming region which is partially depleted upon application of a threshold voltage thereof; and substrate bias voltage providing means for selectively providing a first substrate bias voltage in the standby state and a second substrate bias voltage such as to enhance a current supplying drivability of said first conductivity channel type MOS transistor in the active state to said substrate terminal.

2. The semiconductor device according to claim 1, wherein said substrate bias voltage providing means includes first substrate bias voltage generating means for generating said first substrate bias voltage, second substrate bias voltage generating means for generating said second substrate bias voltage, and substrate bias voltage selecting means coupled to said first and second substrate bias generating means and said substrate terminal for selecting one of said first and second substrate bias voltages provided from said first and second substrate bias generating means in response to a control signal indicative of whether said first and second conductivity channel type MOS transistor are in the standby or active state and providing said selected substrate bias voltage to said substrate terminal.

3. The semiconductor device according to claim 2, wherein said first conductivity channel type MOS transistor is N channel MOS transistor, and said second conductivity channel type MOS transistor is P channel MOS transistor.

4. The semiconductor device according to claim 3, wherein said N and P channel MOS transistors operate in accordance with power supply and ground voltages, said first substrate bias voltage is equal to said ground voltage, and said second substrate bias voltage is equal to said power supply voltage.

5. The semiconductor device according to claim 2, wherein said first conductivity channel type MOS transistor is P channel MOS transistor, and said second conductivity channel type MOS transistor is N channel MOS transistor.

6. The semiconductor device according to claim 5, wherein said P and N channel MOS transistors operate in accordance with power supply and ground voltages, said first substrate bias voltage is equal to said power supply voltage, and said second substrate bias voltage is equal to said ground voltage.

7. A semiconductor device comprising:

a semiconductor substrate;

am insulating layer formed on said semiconductor substrate;

an N channel MOS transistor formed on said insulating layer and operating selectively in standby and active states, said N channel MOS transistor having a first front gate electrode and a first channel forming region which is fully depleted upon application of a threshold voltage thereof;

a P channel MOS transistor formed on said insulating layer and operating selectively in the standby and active states, the P channel MOS transistor being in the standby state when the N channel MOS transistor is in the standby state and the P channel MOS transistor being in the active state when the N channel MOS transistor is in the active state, said P channel MOS transistor having a second front gate electrode and a second channel forming region which is fully depleted upon application of a threshold voltage thereof;

a first back gate electrode contrary to said first front gate electrode sandwiching said first channel forming region therebetween;

a second back gate electrode contrary to said second front gate electrode sandwiching said second channel forming region therebetween;

first substrate bias voltage providing means for selectively providing a first substrate bias voltage in the standby state and a second substrate bias voltage such as to enhance a current supplying drivability of said N channel MOS transistor in the active state to said first back gate electrode; and second substrate bias voltage providing means for selectively providing a third substrate bias voltage in the standby state and a fourth substrate bias voltage such as to enhance a current supplying drivability of said P channel MOS transistor in the active state to said second back gate electrode.

8. The semiconductor device according to claim 7, wherein said first substrate bias voltage providing means includes first substrate bias voltage generating means for generating said first substrate bias voltage, second substrate bias voltage generating means for generating said second substrate bias voltage, and first substrate bias voltage selecting means coupled to said first and second substrate bias voltage generating means and said first back gate electrode for selecting one of said first and second substrate bias voltages provided from said first and second bias voltage generating means in response to a control signal indicative of whether said N and P channel MOS transistors are in the standby or active state and providing said selected substrate bias voltage to said first back gate electrode, and said second substrate bias voltage providing means includes third substrate bias voltage generating means for generating said third substrate bias voltage, fourth substrate bias voltage generating means for generating said fourth substrate bias voltage, and second substrate bias voltage selecting means coupled to said third and fourth substrate bias generating means and said second back gate electrode for selecting one of said third and fourth substrate bias voltages provided from said third and fourth bias voltage generating means in response to said control signal and providing said selected substrate bias voltage to said second back gate electrode.

9. The semiconductor device according to claim 8, wherein said N and P channel MOS transistors operate in accordance with power supply and ground voltages, said first substrate bias voltage is equal to said ground voltage, said second substrate bias voltage is equal to said power supply voltage, said third substrate bias voltage is equal to said power supply voltage, and said fourth substrate bias voltage is equal to said ground voltage.

10. The semiconductor device according to claim 7, wherein said first and second back gate electrodes are buried in said insulating layer.

11. A semiconductor device comprising:

a semiconductor substrate having one main surface and other main surface, an insulating layer formed on said one main surface of said semiconductor substrate a full depletion type first channel MOSFET formed on said insulating layer, a partial depletion type second channel MOSFET formed on said insulating layer, and a terminal formed on said other main surface of said semiconductor substrate and connected electrically to said semiconductor substrate, to which a substrate bias voltage having a first voltage at standby state and a second voltage different from said first voltage such as to enhance a current supplying drivability of said full depletion type first channel MOSFET at active state is applied.

12. A semiconductor device comprising:

an insulating layer, a full depletion type channel MOSFET formed on said insulating layer, a full depletion type P channel MOSFET formed on said insulating layer, a first terminal formed in said insulating layer faced to said full depletion type N channel MOSFET, to which a first substrate bias voltage having a first voltage at standby state and a second voltage different from said first voltage such as to enhance a current supplying drivability of said full depletion type N channel MOSFET at active state is applied, and a second terminal formed in said insulating layer faced to said full depletion type P channel MOSFET, to which a second substrate bias voltage having a third voltage at standby state and a fourth voltage different from said third voltage such as to enhance a current supplying drivability of said full depletion type P channel MOSFET at active state is applied.

* * * * *